(12) United States Patent
Wosik et al.

(10) Patent No.: US 9,594,131 B2
(45) Date of Patent: Mar. 14, 2017

(54) LIQUID NITROGEN COOLED MRI COILS AND COIL ARRAYS

(75) Inventors: Jarek Wosik, Houston, TX (US); Krzysztof Nesteruk, Warsaw (PL); Lei Ming (Patrick) P. Xie (Leiming), Houston, TX (US)

(73) Assignee: THE UNIVERSITY OF HOUSTON SYSTEM, Houston, TX (US)

( * ) Notice: Subject to any disclaimer, the term of this patent is extended or adjusted under 35 U.S.C. 154(b) by 1296 days.

(21) Appl. No.: 13/469,370

(22) Filed: May 11, 2012

(65) Prior Publication Data

US 2012/0293175 A1 Nov. 22, 2012

Related U.S. Application Data

(60) Provisional application No. 61/485,080, filed on May 11, 2011.

(51) Int. Cl.
*G01V 3/00* (2006.01)
*G01R 33/34* (2006.01)
*G01R 33/341* (2006.01)

(52) U.S. Cl.
CPC ..... *G01R 33/34015* (2013.01); *G01R 33/341* (2013.01); *G01R 33/3403* (2013.01); *G01R 33/34007* (2013.01)

(58) Field of Classification Search
CPC .................................................. G01R 33/3403
USPC ........................................ 324/318, 322, 315
See application file for complete search history.

(56) References Cited

U.S. PATENT DOCUMENTS

| 6,812,705 B1* | 11/2004 | Sellers | G01R 33/34076 324/315 |
| 7,759,935 B2* | 7/2010 | DeVries | G01R 33/3403 324/318 |

* cited by examiner

*Primary Examiner* — Louis Arana
(74) *Attorney, Agent, or Firm* — Robert W. Strozier

(57) ABSTRACT

New method of cooling of MRI coil and resonators is disclosed and described. MRI coil designs showed in the disclosure are based solely on the use of copper tube elements filled with liquid nitrogen. Inside the conducting tubes at rf frequency there is no rf electric field, thus the liquid nitrogen presence inside such coils will not have any influence on MRI coil dielectric losses and on the resonant frequency modulation. Liquid nitrogen cooled coils, when in the coil noise regime, demonstrate 2-3 gain of signal-to-noise ratio comparing with room temperature equivalent coils. Methods for making and using both superconducting and normal metal MRI coils and/or arrays in such configurations are also disclosed.

38 Claims, 20 Drawing Sheets

Section A-A

Section A-A

LIQUID NITROGEN COOLED MRI COILS AND COIL ARRAYS

RELATED APPLICATIONS

This application claims priority to and benefit of U.S. Provisional Patent Application Ser. No. 61/485,080, filed 11 May 2011 (May 11, 2011).

BACKGROUND OF THE INVENTION

1. Field of the Invention

Embodiments of this invention relate to novel internally cooled magnetic resonance imagining (IC-MRI) coils, cryogenic apparatuses including the IC-MRI coils and to method for making and using same. Embodiments of the invention also relate to balanced and symmetrically grounded IC-MRI coils.

More particularly, embodiments of this invention relate to novel internally cooled MRI (IC-MRI) coils, resonators, cryogenic apparatuses including the IC-MRI coils, where the IC-MRI coils are constructed so that a coolant (in certain embodiments, a cryo-coolant) circulates through an interior of the coils, through the interior of a substrate on which the coils are mounted, or through both the coils and the substrate, where the electric fields generated by the coils are zero or negligibly small. Embodiments also relate to balanced and symmetrically grounded IC-MRI coils. Embodiments of the invention also relate to methods for making and using the IC-MRI coils, and/or cryogenic apparatuses including the IC-MRI coils.

2. Description of the Related Art

Since the inventions of magnetic resonance imaging (MRI) in 1973, significant advances and developments of this method has turned it into a widely used clinical and research tool, which provides an unsurpassed, non intrusive technique to image soft tissues. The MRI is related to the phenomenon of nuclear magnetic resonance (NMR), which is based on the excitation and relaxation of nuclei (most frequently protons) within living tissues in a DC magnetic field. An excitation repulse at the Larmor frequency v, which is the precession frequency of protons in DC magnetic field (v=63.8 MHz for 1.5 Tesla), disturbs the equilibrium state of the nuclei. After the repulse, the nuclei relax to the equilibrium state with two different relaxation times ($T_1$ and $T_2$) and produce a weak decaying of signal.

In a MRI set-up, these weak decaying rf signals are detected by a receiver probe. For diagnostic usefulness of this signal, its level has to be well above the noise level, thus it puts premium on signal-to-noise ratio (SNR) of the receiver probe. In small volume MRI, MRI microscopy, low-field MRI, and NMR spectroscopy it has been shown that the Johnson noise of the rf receiver probe and/or preamplifier dominates, and thus determines the system noise floor.

In recent years, the design of phased arrays for parallel acquisition in MRI application has become the subject of a great deal of research. The drive for faster and faster acquisition rates calls for arrays with large number of receiving elements. As the number of array elements increases and their size continues to decrease, conductive losses become more dominant. These losses can overwhelm any signal-to-noise ratio (SNR) gains expected from the use of smaller coils that express less body noise.

As the need for higher signal-to-noise ratio and greater resolution increases, the benefit from using cryogenic and/or superconducting coils greatly depends on the ratio between coil and body noise. Although many different MRI systems exist, each has a specific coil/body noise ratio that depends on frequency of operation and coil size.

Prior art MRI probes exist in a variety of geometrical configurations. U.S. Pat. No. 5,699,801 to Atalar discloses an MRI probe having pair of electrodes arranged in a parallel configuration and embedded within a dielectric material.

U.S. Pat. No. 4,672,972 to Berke discloses an NMR probe embedded within a probe head region disposed at the distal end of a catheter/endoscope.

U.S. Pat. No. 6,171,240 to Young et al. discloses a radio frequency (ARF.congruent.) probe adapted for use in MRI comprising a loop of an elongated electrical conductor arranged to form a twisted wire pair and a means for operating the probe in a transmit and receive mode for intraluminal MRI.

U.S. Pat. No. 7,511,497 disclosed superconducting array of surface MRI probes and U.S. Pat. No. 6,950,063 disclosed intraluminal MRI probe.

Thus, there is a need in the art for novel internally cooled magnetic resonance imaging (IC-MRI) coils and new apparatus utilizing such IC-MRI coils, where a coolant circulates through an interior of the coils, through a substrate on which the coil are formed, or through both.

SUMMARY OF THE INVENTION

Embodiments of this invention provide novel MRI coil apparatuses including at least one internally cooled magnetic resonance imagining (IC-MRI) coil. Each IC-MRI coil includes at least one coolant flow channel passing through an interior of the coil, through an interior of a substrate on which the coil is formed, or through both an interior of the coils and substrate, where the electric fields generated by the coil is zero or negligibly small within the flow channel reducing a signal-to-noise component related to contact of a coolant with external surfaces of the coil.

Embodiments of this invention provide novel IC-MRI coils including includes at least one coolant flow channel passing through an interior of the coil, through an interior of a substrate on which the coil is formed, or through both an interior of the coils and substrate, where the electric fields generated by the coil is zero or negligibly small within the flow channel reducing a signal-to-noise component related to contact of a coolant with external surfaces of the coil.

Embodiments of this invention provide novel IC-MRI coils including hollow conductors, where the interior forms a flow channel through which a coolant flow, where the electric fields generated by the coils are zero or negligibly small in the flow channel reducing a signal-to-noise component related contact of a coolant with external surfaces of the conductors.

Embodiments of this invention provide novel IC-MRI coils including hollow conductors and/or hollow coil substrate, where the interior of the coil and/or the interior of the substrate form flow channels through which a coolant flows, where the electric fields generated by the coils are zero or negligibly small in the flow channels reducing a signal-to-noise component related to contact of the coolant with external surfaces of the coil and/or substrate.

Embodiments of this invention provide novel cryogenic apparatuses including at least one internally cooled magnetic resonance imagining (IC-MRI) coil. Each IC-MRI coil includes at least one coolant flow channel passing through an interior of the coil, through an interior of a substrate on which the coil is formed, or through both an interior of the coil and substrate, where the electric field generated by the coil is zero or negligibly small within the flow channel reducing a signal-to-noise component related to contact of a coolant with external surfaces of the coil.

Embodiments of this invention provide novel cryogenic apparatuses including an MRI coil including hollow conductors and/or hollow coil substrates, where the interior of the conducts and/or the coil substrates forms flow channels through which a coolant flows, where the electric field generated by the coil is zero or negligibly small within the flow channel reducing a signal-to-noise component related to contact of a coolant with external surfaces of the coil.

Embodiments of this invention provide methods of making the IC-MRI coils and apparatuses including IC-MRI coils. The method includes providing a housing have a removable top including at least one aperture, a vacuum port and an electric cable port. The method also includes forming a coolant reservoir in an upper zone of the housing, where the coolant reservoir includes a coolant inlet and coolant outlet and at least one pair of apertures in a bottom of the reservoir. The method also includes inserting a first hollow tube through one of apertures in the bottom of the reservoir into a lower zone of the housing so that a proximal end of the first tube is located in an interior of the reservoir so that the coolant level may be maintained above the proximal end of the first tube. In certain embodiments, the proximal end of the first tube is flush with the bottom of the reservoir. The method also includes inserting a second hollow tube through one of the apertures in the top of the housing, through the second aperture of the pair of apertures in the bottom of the reservoir and into the lower zone of the housing. The method also includes attaching an IC-MRI coil including at least one coil coolant inlet and at least one coil coolant outlet and an internal coil coolant flow path through the IC-MRI coil. The distal end of the first tube is connected to the at least one coil coolant inlet, while the second tube is connected to the at least one coil coolant outlet. The coil is disposed near a bottom of the lower zone of the housing. An internal electronic component is mounted inside the lower zone of the housing on an outer surface of the bottom of the reservoir. The internal electronic component is connected via a cable extending from the internal electronic component through the electronic port to an external electronic component. The internal electronic component is also connected via a second cable to the coil or coils. The internal electronic component may also be cooled by the coolant through coolant inlet and outlet tubes connected to a coolant inlet and a coolant outlet of the internal electronic component in the same orientation as the coolant inlets and outlets of the coil. Alternatively, the coolant tubes for the coils may include Y or T branches to direct coolant to both the coils and the internal electronics.

Embodiments of this invention provide methods of using the apparatuses of this invention, where the method includes filling the reservoir of the apparatus with a coolant. In certain embodiments, the coolant is a cryo-coolant. The methods also include evacuating the lower zone of the housing to a desired low pressure. The methods also include allowing time for system to equilibrate to a coolant temperature and low pressure. The methods also include positioning the bottom of the housing above a material to be analyzed by MRI imaging—where the material may be an animal or animal body part, a plant or plant body part, a machine or machine part or any other material amenable for MRI imaging. The methods also include performing an MRI imagining procedure using the MRI coils as the detectors utilizing the internal and external electronic components. The methods also include establishing a gravity coolant flow into the proximal end of the first tube, through the first hollow tube, into the coolant inlet of the IC-MRI coil, through the flow channel of the IC-MRI coil, out of the coolant outlet of the IC-MRI coil, into the distal end of the second hollow tube, through the second hollow tube and out of the proximal end of the second hollow tube, which vents into the atmosphere.

Embodiments of this invention provide methods of making the IC-MRI coils of this invention. The methods include forming a coil having an internal coolant flow channel or a plurality of microfluidic channels, where the channels may be through an interior of the coil material or through a channel or microfluidic channels in a substrate on which the coil is formed. In one embodiment, the IC-MRI coils comprise a hollow tube or a plurality of hollow tube sections formed into a coil configuration. In another embodiment, the IC-MRI coils comprise a fabricated coil including a dielectric having a fluid channel or a plurality of fluid channels formed therein and a conducting material disposed on an exterior surface of the dielectric over the channel or channels so that coolant flowing through the channels will cool the conducting material and where the conducting material forms a desired coil configuration.

BRIEF DESCRIPTION OF THE DRAWINGS

The invention can be better understood with reference to the following detailed description together with the appended illustrative drawings in which like elements are numbered the same.

DEFINITIONS OF TERMS OF THE INVENTION

Figure 1:
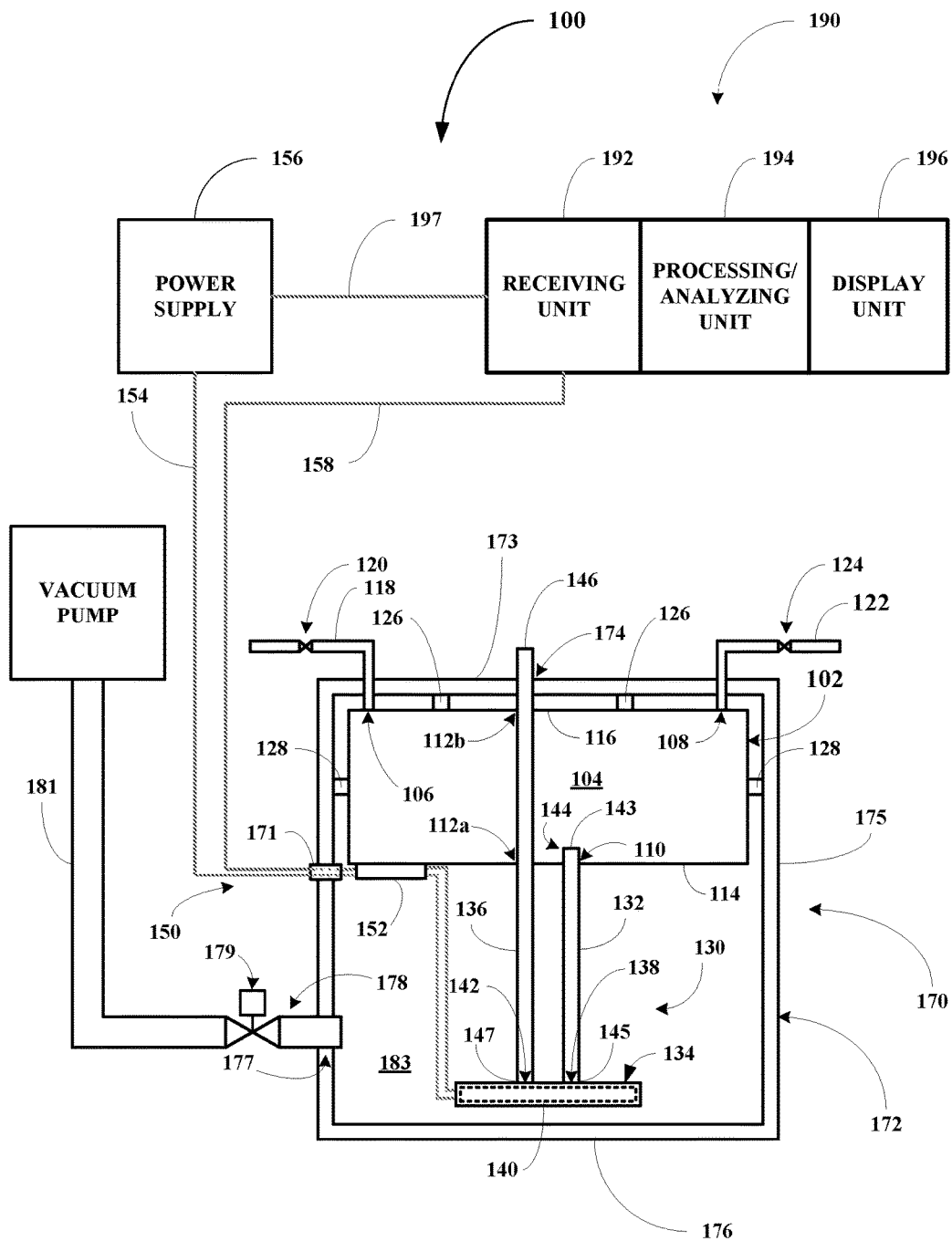
FIG. 1 depicts an embodiment of an apparatus of this invention including an IC-MRI coil.

The term "negligibly small" or "substantially zero" in the context of an electric field means that the electric field is within less than or equal to about 500 mV/mm. In other embodiments, the electric field is within less than or equal to about 250 mV/mm. In other embodiments, the electric field is within less than or equal to about 100 mV/mm. In other embodiments, the electric field is within less than or equal to about 50 mV/mm. In other embodiments, the electric field is within less than or equal to about 10 mV/mm. In other embodiments, the electric field is within less than or equal to about 1 mV/mm. In other embodiments, the electric field is within less than or equal to about 500 μV/mm. In other embodiments, the electric field is within less than or equal to about 250 μV/mm. In other embodiments, the electric field is within less than or equal to about 100 μV/mm. In other embodiments, the electric field is within less than or equal to about 10 μV/mm. In other embodiments, the electric field is within less than or equal to about 1 μV/mm.

DETAILED DESCRIPTION OF THE INVENTION

The inventors have found that MRI coils or resonators (these terms are used interchangeably throughout the application) can be constructed including at least one coolant flow path through an interior of the coils, an interior of substrates on which the coils are formed or through both the interior of the coils and/or the interior of the substrates. As coolant circulates or passes through the interior of the coils and/or the interior of the substrates, the coolant lowers the coil temperature and resistance, thus improving a signal-to-noise ratio due to the reduced temperature, but also reducing a contribution of to signal-to-noise due to contact of a coolant with exterior surfaces of the coils. Coil stability is also improved and in addition, electronics (or circuitry) needed for coil tuning matching and detuning may also be cooled. The MRI apparatuses of this invention permit the construction and operation of compact self contained, readily transportable cryogenic MRI coils. In the present designs, a coolant such as a cryo-coolant (e.g., liquid nitrogen), circulates or passes through an interior of the MRI coil exerting no influence on MRI coil losses or on a resonant frequency of the MRI coil. The cryo-cooled coils of this invention, when operating in the coil noise regime, demonstrate a 2-3 times or higher gain in signal-to-noise ratio (SNR) for normal metals and higher SNR gains for superconductors, when compared with room temperature equivalent coils. The magnitude of the increase in SNR is determined by the coil-noise to body-noise ratio measured at room temperature. The invention also provides methods for making and using the MRI coils and/or MRI coil arrays of this invention. The apparatuses and methods for using the apparatuses of this invention may be constructed out of normal metal and/or superconducting materials.

MRI is a signal-to-noise ratio (SNR) limited technique, resulting in a strong desire in the MRI industry to develop new MRI methodologies and designs to achieve better signal-to-noise ratios (SNR). Cryogenically cooled normal metal and/or superconducting MRI coils significantly reduce thermal noise contributions to SNR. There is a promising market niche for both clinical and research applications using high temperature superconductor (HTS) surface coil probes in high-resolution high SNR MRI applications. Also reduced-cost, low-field MRI may lead to a sizeable future market for HTS receiver probes, because such apparatuses and methods have the potential to reduce future healthcare costs. There also may develop a concentrated but significant market in biology research labs and clinics for low-cost, low-field "benchtop" MRI systems.

Since the inventions of MRI in 1973, significant progress and development has turned the method into a widely used clinical and research tool, which has provided unsurpassed ability to image soft tissues. MRI is related to the phenomenon of nuclear magnetic resonance (NMR), which is based on the excitation and relaxation of nuclei (most frequently protons) within living tissues in a dc magnetic field. An excitation rf pulse at the Larmor frequency ν, which is the precession frequency of protons in a dc magnetic field (ν=21.3 MHz for 0.5 Tesla), disturbs the equilibrium state of the nuclei. After the rfpulse, the nuclei relax to an equilibrium state. The relaxation has two different relaxation times, $T_1$ and $T_2$ and produces a weak decaying rf response signal. In a MRI set-up, such signals are detected by a receiver probe (coil/resonator). For diagnostic usefulness of such signals, their signal strength or level has to be well above the noise level to be detected and analyzed, putting a premium on the signal-to-noise ratio (SNR) of the receiver probe. In small volume MRI, MRI microscopy, low-field MRI, and NMR spectroscopy, it was shown that the Johnson noise of the rf receiver probe and/or preamplifier dominates. This noise determines a system noise floor for each coil type. Therefore, it is desirable to reduce thermal coil noise to improve image resolution and to reduce image acquisition time. Because the Johnson noise is a function of the product of resistance and temperature, reduction of either or both of these parameters will enhance SNR values. In addition, improved SNR can be traded for smaller voxel sizes, thereby increasing resolution of structural details in the acquired image.

Thermal noise reduction can be achieved by cooling either normal metal MRI coils or by constructing the coils out of superconducting materials. High-temperature superconductors (HTS) are extremely attractive for such applications due to their very low losses. A superconductor is completely lossless (below its critical temperature) at zero frequency, provided that the dc current is less than the critical current. At higher frequencies, finite losses do result when rf screening currents are flowing near the surface of the coils within a penetration depth of about 0.2 μm. These losses are due to the presence of uncondensed normal carriers. Microwave measurements of $YBa_2Cu_3O_x$ (YBCO) epitaxial films at 77 K yield a surface resistance $R_s$ of 150 μΩ at 10 GHz, which is nearly two orders of magnitude lower than a surface resistance of oxygen-free high thermal conductivity (OFHC) copper at the same frequency and temperature. YBCO material is one of the kinds of known HTS materials. Current technology allows deposition of YBCO not only on rigid expensive single crystal substrate, but also on flexible substrates, which allow for bending YBCO MRI coils. Scaling the values of $R_s$ down to values corresponding to a frequency of 100 MHz indicates that superconducting YBCO will have a surface resistance at least four orders of magnitude lower than that of OFHC copper at this frequency.

Many MRI research or/and clinical applications require a larger field-of-view than can be achieved using individual surface coils. Large fields-of-view may be performed by simultaneous acquisition of signals from a plurality of decoupled receiver coils. This approach is analogous to phased array radar and offers SNR and resolution of small surface coils over fields-of-view normally associated with volume coils with no increase in imaging time. Such an approach requires an MRI scanner to be equipped with a multi-channel receiver. Most of the modern scanners have at least four channel receivers build-in.

Cooling receiver coils to cryogenic temperatures is very challenging. The coils have to be in efficient thermal contact with a coolant during long acquisition times, procedures, or protocols, sometimes very long acquisition times, procedures or protocols. Generally, these coils are separated from direct contact with a cryo-coolant such as liquid nitrogen (LN), because boiling coolant causes fluctuations in a value of a dielectric constant of coolant in contact with the surfaces of the coils. Due to boiling, coolant in contact with the coils is a mixture of coolant gas and liquid. For nitrogen, the dielectric constant of nitrogen gas is 1 and the dielectric constant for nitrogen liquid is 1.5. The dielectric constant over time will depend on a gas to liquid volume ratio over time. Changes in the gas to liquid volume ratio over time introduces a modulation effect on a resonant frequency of high quality-factor cryogenic MRI coils. The required separation of MRI coils from boiling liquid forces cryostat designers to make complex and complicated configurations in order to assure thermal contact between the coils and the coolant. Such design criteria results in the use of either low cooling power systems or expensive and large closed cycle cryo-coolers. The level of cooling complexity increases when coil arrays are used instead of a single coil.

The coil and array designs of this invention are composed of coil structure that include an internal flow channel or a plurality of internal flow channels so that a coolant circulates through an interior of the structure (either through the coils themselves, through substrates on which the coils are formed or through both), where the electric field generated by the coil or array is zero or negligibly small. As the coolant circulated through the interior of the structure, the coil or array is cooled to a desired low temperature. In certain embodiments, the coil structures of this invention include hollow conducting conduits or hollow conducting tubes such as OFHC copper, silver or superconductor coated (outer surface) conducting or non-conducting conduits or tubes. In other embodiments, the coil structures include non-conducting tubes with conducting layers formed or deposited thereon, where the conducting layers may be continuous or discrete provided that electric fields generated by the layers are zero or substantially zero (equivalent to negligibly small). In other embodiments, the coils structures of this invention comprise fabricated constructs including conducting material formed on a top and bottom of a dielectric substrate including an internal flow channel or network of flow channels formed in the interior of the dielectric or the dielectric is formed on a microfluidic substrate (a three layer construct). In certain embodiments, the flow channels may be microfluid channels and the coil or coil arrays may be micro arrays, where the term micro means that the channels are mm-scaled channels, µm-scaled channels or nm-scaled channels and the coils are cm-scaled coils, mm-scaled coils, µm-scaled coils or nm-scaled coils. The internal flow channels of these constructs are generally configured so that the flow channels are in registry with the conducting layers, but are of a smaller width than the width of the conducting layers. In certain embodiments, the coolant is in direct contact with a portion of a bottom surface of the conducting layers, while in other embodiment, the coolant is in contact with the a thin layer of the dielectric depending on the degree of etching of the dielectric under the conducting layers during fabrication. In other embodiments, a dielectric substrate is deposited on top of a microfluidic constructed and the conducting material is deposited on the dielectric substrate to form a three layer construct.

In the construction of these internally cooled MRI coil constructs, the inventors take advantage of the fact that rf currents. In the case of a closed surface (such as a tube or a closed conduit), flow only on an outer surface of the tube or conduit within a volume is determined by a skin depth of the conducting material. Skin depths for copper at 128 MHz (3 Tesla) and 300 MHz (7 Tesla) are about 5.9 µm and 4.9 µm, respectively. As a result, inside the closed conducting surface, there is no rf electric field. Thus, a cryo-coolant such as liquid nitrogen may be circulated through the inside or interior of the MRI coil and/or array constructs and at the same time, avoiding dielectric influences of the cryo-coolant on the MRI coil and/or array construct performance. In addition, such boiling liquid flowing within the interior of the constructs will permit improved cooling and temperature stability, without influencing its operating frequency. For example, using liquid nitrogen, the coils can be maintained at a stable 77 K temperature, because the coil surface is not in contact with the coolant, the gas to liquid volume ratio inside the constructs has no effect properties of the coil.

In many of the coil configurations and arrays of these coils, capacitors are required for frequency tuning and for coil isolation. In principle, any coil have both an inductance and capacitance. Any loop will have inductance proportional to the coil length. For a single wire loop, we usually add a capacitor (solder it). However, some coil designs have so called distributed capacitance such as double sided coils, which have distributed capacitor and therefore distributed capacitance. The distributed capacitance are created by the dielectric interposed between upper and bottom conducting surfaces. Such structures will resonate at a certain frequency, but generally, additional capacitor (or capacitors) are needed to tune the coils to resonate at a desired frequency. Thus, coils of this invention may include both localized capacitance and distributed capacitance, which is distributed over the coil volume, where the two capacitances contribute affect the resonate frequency of the coils or coil arrays.

The coils and coil array of this invention may be constructed on rigid substrates or may be rigid once constructed or they may be constructed on flexible substrates or may be flexible once constructed. The particular application will dictate whether the coil or coil array construct is rigid or flexible. The cooling system of this invention may have bottoms that are curved or shaped conforming to a curved or shaped coil of coil array.

Suitable coolants include, without limitation, nitrogen gas or liquid, provided that the gas is at a temperate at or below about 200K, helium gas or liquid, provided that the gas is at a temperature at or below about 200 K, argon gas or liquid, provided that the gas is at a temperature at or below about 200 K, or any other coolant that can maintain a coil temperature at or below about 200 K or mixtures or combinations thereof. In other embodiments, the temperature is at or below about 150 K. In other embodiments, the temperature is at or below about 120 K. In other embodiments, the temperature is at or below about 110 K. In other embodiments, the temperature is at or below about 100 K. In other embodiments, the temperature is at or below about 90 K. In other embodiments, the temperature is at or below about 80 K.

In another embodiment, a magnetic imagining coil system includes a housing comprising: a top having a first outlet conduit aperture, a bottom, an interior, a vacuum valve adapted to be detachably connected a vacuum pump via a vacuum conduit for evacuating the interior, and a feed through fitting. The system also includes a coolant reservoir, disposed in an upper portion of the housing, including: a top having a second outlet conduit aperture, a bottom having an inlet conduit aperture and a third outlet conduit aperture, and an interior for receiving a coolant. The system also includes at least one magnetic imagining coil comprising: a conductor, at least one internal flow channel for circulating a coolant therethrough, where an electric field generated by the conductor is zero or substantially zero, and a coolant inlet and a coolant outlet, at least one capacitor, where the capacitor adjusts a capacitance of the coil, a coolant inlet conduit extending from the coolant inlet through the inlet conduit aperture to a position at or near the bottom of the reservoir, and a coolant outlet conduit extending from the coolant outlet through the third outlet conduit aperture, through the interior of the reservoir, through the second outlet conduit aperture, through the first outlet conduit aperture to a position at or above the top of the housing. The system also includes an internal electronic unit comprising: tuning/matching and detuning circuitry, wires connecting the circuitry to the coils, a power cable connected to the power supply, and an rf cable connected to the rf receiving component of the external electronic unit, where the cables extend from the internal electronic unit through the fitting. In certain embodiments, the conductor is a conducting tube and the flow channel comprises an interior of the tube.

In other embodiments, the conductor is a conducting tube including a superconducting shell and the flow channel comprises an interior of the tube. In other embodiments, the conductor is a conducting tube including opposing superconducting layers formed on opposite portions of the tube and the flow channel comprises an interior of the tube. In other embodiments, the system further comprising a non-conducting tube and wherein the conductor comprises a conducting shell formed on an outer surface of the tube and the flow channel comprises an interior of the tube. In other embodiments, the system further comprising a non-conducting tube and wherein the conductor comprises a superconducting shell formed on an outer surface of the tube and the flow channel comprises an interior of the tube. In other embodiments, the system further comprising a non-conducting tube and wherein the conductor comprises opposing conducting layers formed on opposite portions of the tube and the flow channel comprises an interior of the tube. In other embodiments, the system further comprising a non-conducting tube and wherein the conductor comprises opposing superconducting layers formed on opposite portions of the tube and the flow channel comprises an interior of the tube. In other embodiments, the conductor comprises a pattern conducting layer formed on a top surface and a bottom surface of a dielectric layer and the flow channel comprises micro-channels formed in the dielectric layer. In other embodiments, the capacitor is built in and comprises a dielectric interposed between two portions of the conductors. The coil subsystem may include a single coil, a plurality of coils, an array of coils, a plurality of coil arrays or a combination of single coils and coil arrays.

DETAILED DESCRIPTION OF THE DRAWINGS

First System Embodiment

Referring to FIG. 1, an embodiment of a system of this invention, generally 100, is shown to include a cryostat subsystem 102, an internally cooled magnetic resonance imaging (IC-MRI) coil subsystem 130, an internal tuning/matching and detuning electronic subsystem 150, a vacuum subsystem 170 and a receiving and processing subsystem 190.

The cryostat subsystem 102 includes a cryo-coolant reservoir 104 including optionally a coolant supply port 106 and optionally a coolant supply exhaust port 108. The system 102 also includes a coolant inlet conduit port 110 and an bottom coolant outlet conduit port 112a through a bottom 114 of the reservoir 104 and a top coolant outlet conduit port 112b in a top 116 of the reservoir 104. The coolant supply port 106 and exhaust port 108 are optional, because the reservoir 104 may be filled prior to assembly of the vacuum subsystem 170 described herein. If the cryostat subsystem 102 includes the ports 106 and 108, they are, as shown here, connected to a coolant supply conduit 118 having a shut off valve 120 and an exhaust conduit 122 also having a shut off valve 124. The reservoir 104 is supported by top mounts 126 and optionally by side mounts 128.

The IC-MRI coil subsystem 130 includes a coolant inlet conduit 132, an IC-MRI coil 134, and a coolant outlet conduit 136. The IC-MRI coil 134 includes a coolant inlet aperture 138, an internal coolant flow channel 140 and a coolant outlet aperture 142. The coolant inlet conduit 132 extends through the coolant inlet conduit port 110 with a top 143 of the coolant inlet conduit 132 positioned at a location 144, which may be flush with or above the inlet conduit port 110, and a bottom 145 of the coolant inlet conduit 132 connected to the coolant inlet aperture 138. While the coolant outlet conduit 136 extends through a conduit outlet port 174 in a top 173 of the vacuum subsystem 170, through the top outlet conduit port 112b, through the reservoir 104, and through the bottom outlet conduit port 112a with a top 146 positioned above the top 173 of the vacuum subsystem 170 so that the coolant vents into the surroundings and a bottom 147 connected to the coolant outlet aperture 142.

The tuning/matching and detuning electronic subsystem 150 comprises an internal electronic unit 152 positioned in an interior 183 of the vacuum subsystem 170. The subsystem 150 also includes a power cable 154 connecting the internal electronic unit 152 to a power supply 156. The subsystem 150 also includes an rf cable 158 connecting the internal electronic unit 152 to the receiving and processing subsystem 190. The cables 154 and 158 pass out of the vacuum subsystem 170 through a feed through fitting 171. In the embodiment shown here, the internal electronic unit 152 is disposed on the bottom 114 of the reservoir 104 so that the unit 152 is cooled to reduce noise. The internal electronic unit 152 includes an electronic board with tuning, matching and detuning circuitry.

The vacuum subsystem 170 includes a vacuum housing 172 including the top 173 having the conduit outlet port 174, at least one side wall 175 and a bottom 176. The vacuum subsystem 170 also includes a vacuum port 177 equipped with a vacuum fitting 178 having a valve 179 connected to a vacuum pump 180 via a conduit 181. The vacuum subsystem 170 also includes the feed through fitting 171 through which the cables 154 and 158 extend out of the housing 172 without disrupting the vacuum in the interior 183 of the housing 172.

The receiving and processing subsystem 190 includes a receiving unit 192, a processing/analyzing unit 194, and a display unit 196 connected to the power supply 156 via a second power cable 197. The rf cable 158 is connected to the receiving unit 192, which receives a signal from the internal electronic unit 152. The signal is then processed and analyzed in the processing/analyzing unit 194 and displayed on the display unit 196.

Second System Embodiment

Figure 2:
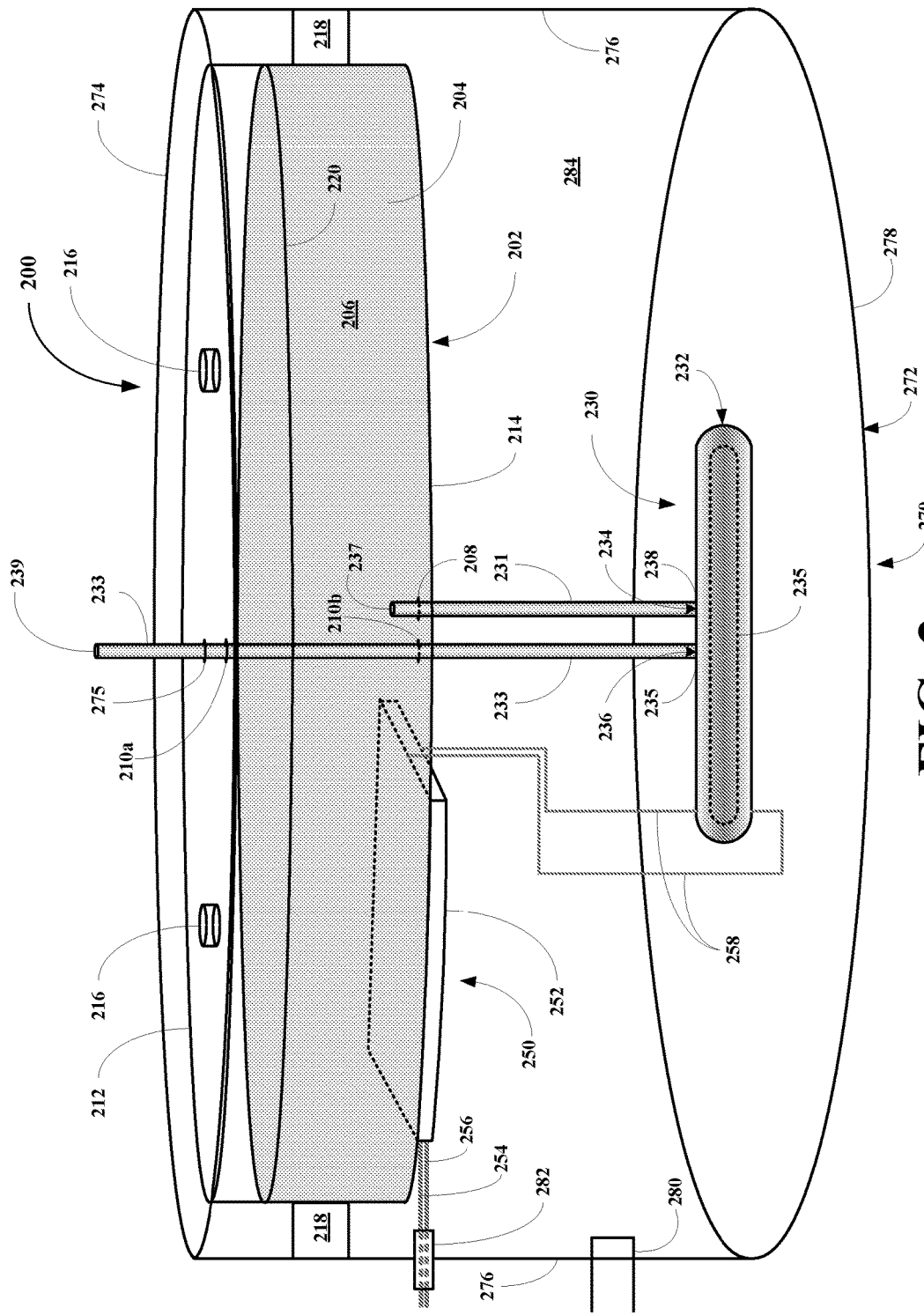
FIG. 2 depicts another embodiment of an apparatus of this invention including an IC-MRI coil.

Referring to FIG. 2, another embodiment of a system of this invention, generally 200, is shown to include a cryostat subsystem 202, an internally cooled magnetic resonance imaging (IC-MRI) coil subsystem 230, an internal tuning/matching and detuning electronic subsystem 250, and a vacuum subsystem 270 (only a portion shown here).

The cryostat subsystem 202 includes a cryo-coolant reservoir 204 including a coolant 206, a coolant conduit inlet port 208 and coolant conduit outlet ports 210a&b, one through a top 212 and a bottom 214 of the reservoir 204, respectively. The reservoir 204 is supported by top mounts 216 and optionally by side mounts 218. The top mounts 216 are detachably engaged or affixed to a top 274 of a vacuum housing 272. The reservoir 204 is filled with the coolant 206 to a coolant level 220.

The IC-MRI coil subsystem 230 includes a coolant inlet conduit 231, an IC-MRI coil 232, a coolant outlet conduit 233. The IC-MRI coil 232 includes a coolant inlet aperture 234, an internal coolant flow channel 235 and a coolant outlet aperture 236. A top 237 of the coolant inlet conduit 231 is located either flush with or just above the coolant conduit inlet port 208, and a bottom 238 of the coolant inlet conduit 231 is connected to the inlet aperture 234. If the top 237 of the coolant inlet conduit 231 is disposed above the coolant conduit inlet port 208, then the coolant level 220 should be above the top 237 of the conduit 231. A top 239 of the coolant outlet conduit 233 is located above a top 274 of the vacuum housing 272 so that the spent coolant vents into the surrounding. The outlet conduit 233 extends through the outlet conduit port 275 in the top 274 of the vacuum housing 272, through the port 210a in the top 212 of the reservoir 204, through the reservoir 204, through the port 210b in the bottom 214 of the reservoir 204 and connects to the outlet aperture 236. Alternatively, the outlet conduit 233 could extend through the top 274 or sides 276 of the vacuum housing 272, without extending through the reservoir 204.

The tuning/matching and detuning electronic subsystem 250 comprises an internal electronic unit 252 comprising tuning/matching and detuning circuitry positioned in an interior 284 of the vacuum subsystem 270 as described herein. The system 250 also includes a power cable 254 connected to the unit 252 and extending out of vacuum subsystem 270 as described below. The system 250 also includes an rf cable 256 connected to the unit 252 and extending out of the vacuum subsystem 270 as described below. The unit 252 is connected to the IC-MRI coils 232 via wires 258.

The a vacuum subsystem 270 includes the vacuum housing 272 including the top 274 having the outlet conduit port 275, at least one side wall 276 and a bottom 278. The vacuum subsystem 270 also includes a vacuum port 280. The vacuum subsystem 270 also includes a feed through fitting 282 adapted to receive the cables 254 and 256. The feed through fitting 282 is adapted to permit the cables 254 and 256 to extend into the interior 284 of the housing 272 without disrupting the vacuum in the interior 284.

Third System Embodiment

Figure 3:
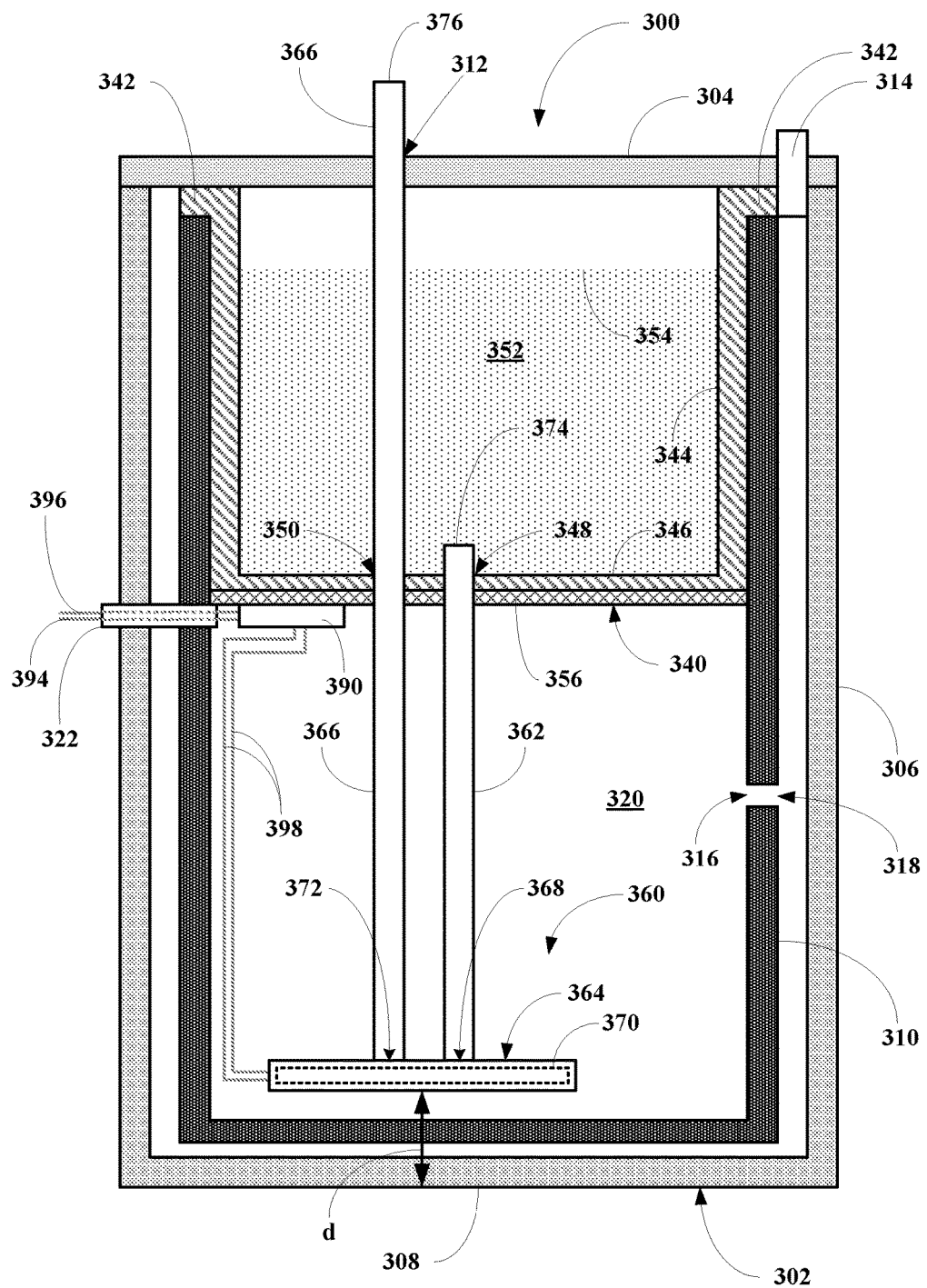
FIG. 3 depicts another embodiment of an apparatus of this invention including an IC-MRI coil.

Referring to FIG. 3, another embodiment of a system of this invention, generally 300, is shown to include a vacuum housing 302. The housing 302 includes a removable top 304, at least one sidewall 306, a bottom 308 and an insulating liner 310. The top 304 includes a top outlet conduit port 312 and a vacuum fitting 314. The liner 310 includes an aperture 316 passing through the liner 310 at a location 318 so that an interior 320 of the housing 302 may be evacuated. The insulating liner 310 comprises insulating materials such as Mylar®/aluminum (Mylar® is a registered trademark of the E. I. du Pont de Nemours and Company for a polyester film) or other similar structural insulating materials for use in evacuated housing. The housing 302 also include a feed through fitting 322 passing from the interior 320 out through the sidewall 306.

The system 300 also includes a cryo-coolant reservoir 340 supported on the liner 310 via a lip 342. The reservoir 340 includes at least one side wall 344 and a bottom 346. The reservoir 340 also includes an inlet conduit port 348 and an outlet conduit port 350. The reservoir 340 is filled with a coolant 352. The coolant 352 is shown here filled to a coolant level 354. The reservoir 340 also includes a cryo-pump material layer 356 disposed on the bottom 346 of the reservoir 340. The layer 356 comprises zeolites and/or carbon that, at low temperature, absorbs molecules of residual air or moisture increasing vacuum.

The system 300 also includes an internally cooled, magnetic resonance imaging (IC-MRI) subsystem 360. The IC-MRI subsystem 360 includes a coolant inlet conduit 362, a IC-MRI coil 364 and a coolant outlet conduit 366. The IC-MRI coil 364 includes a coolant inlet aperture 368, an internal flow channel 370 and a coolant outlet aperture 372. The IC-MRI subsystem 360 is disposed in the system 300 so that a top 374 of the inlet conduit 362 is either flush with or above the inlet conduit port 348 of the reservoir 340 and a top 376 of the outlet conduit 366 is above the top 304 of the housing 302 to vent spent coolant. The inlet conduit 362 extends through the port 348 and connects to the inlet aperture 368 of the IC-MRI coil 364. The outlet conduit 366 extends through the top outlet port 312 of the top 304 of the housing 302, through the reservoir 340 and through the outlet conduit port 350 of the reservoir 340 and connects to the coolant outlet aperture 372. The reservoir 340 is filled with the coolant 352 so that the coolant level 354 is above the top 374 of the inlet conduit 362. The IC-MRI coil 364 is disposed in the interior 320 of the housing 302 near at a position a distance d from the bottom 308 of the housing 302. The distance d should be as small as practical and is generally less than about 10 mm. In other embodiments, the distance d is less than about 5 mm. In other embodiments, the distance d is less than about 2.5 mm. In other embodiments, the distance d is less than about 2 mm. In other embodiments, the distance d is less than about 1 mm.

The system 300 also includes an internal electronic unit 390 disposed on a bottom surface 392 of the layer 356 so that the unit 390 is cooled to reduce noise. The unit 390 also includes a power cable 394 and an rf cable 396. The cables 394 and 396 extend from the unit 390 out of the vacuum housing 302 via a feed through fitting 322. The cable 394 connects the unit 390 to an external power supply (not shown), while the cable 396 connects the unit 390 to an external electronic unit (not shown), which receives an rf signal from the unit 390 and processes and analyzes the signal to generate an MRI image. The unit 390 is also connected to the coil 364 via wires 398.

In all of the system embodiments, the coil component may be a single coil or an array of coils, with the proviso that the coolant is circulated through each coil or circulated through the entire array.

Coil Embodiments

Figure 4A:
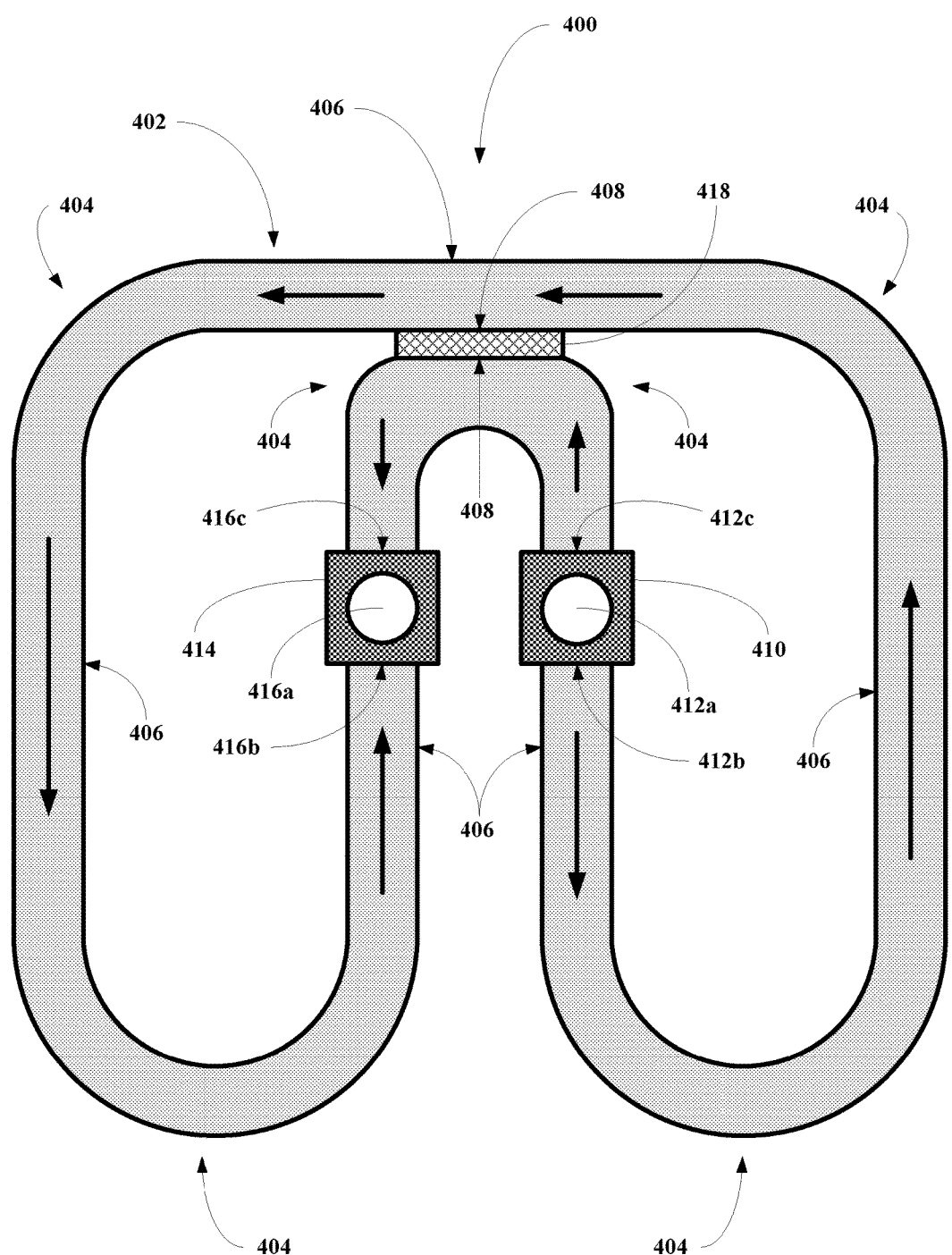
FIG. 4A depicts an embodiment of an IC-MRI coil of this invention including hollow conductors.

Referring to FIG. 4A, an embodiment of an internally cooled magnetic resonance imaging (IC-MRI) coil of this invention, generally 400, is shown to include a hollow loop 402 with rounded corners 404, straight portions 406 and two capacitor portions 408. The subsystem 400 also includes a coolant inlet block 410 having a top coolant inlet aperture 412a and two side apertures 412b&c. The top aperture 412a is adapted to receive a coolant inlet conduit (not shown). The subsystem 400 also includes a coolant outlet block 414 having a top coolant outlet aperture 416a and two side apertures 416b&c. The top aperture 416a is adapted to receive a coolant outlet conduit (not shown). The subsystem 400 also includes a capacitor 418 interposed between the two capacitor portions 408, where the capacitor 418 is adapted to adjust a capacitance of the IC-MRI coil 400. As shown in the figure by the flow arrows, the coolant enters the inlet aperture 412a and flows through the loop 402 and exits out of the aperture 416a. In this design, the apertures 412c and 416c may have a different diameter than the apertures 412b and 416b so that the flow of coolant through the loop 402 is uniform.

Figure 4B:
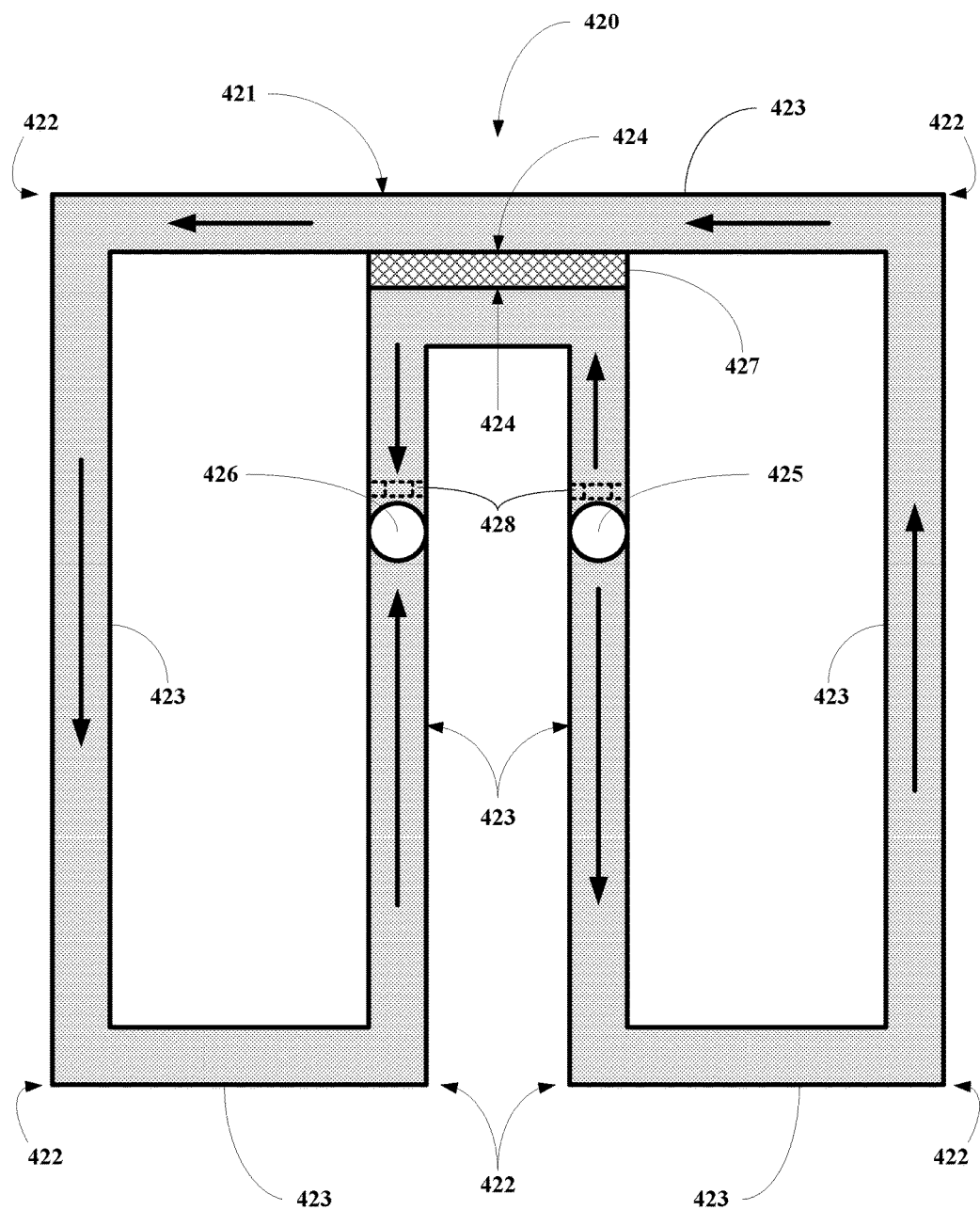
FIG. 4B depicts another embodiment of an IC-MRI coil of this invention including hollow conductors.

Referring to FIG. 4B, another embodiment of an IC-MRI coil of this invention, generally 420, is shown to include a hollow loop 421 with rectangular corners 422, straight portions 423 and two capacitor portions 424. The IC-MRI coil 420 also includes an inlet aperture 425. The inlet aperture 425 is adapted to receive a coolant inlet conduit (not shown). The IC-MRI coil 420 also includes an outlet aperture 426. The outlet aperture 426 is adapted to receive a coolant outlet conduit (not shown). The IC-MRI coil 420 also includes a capacitor 427 interposed between the two capacitor portions 424, where the capacitor 427 is adapted to adjust a capacitance of the IC-MRI coil 420. As shown in the figure by the flow arrows, the coolant enters the inlet aperture 425 and flows through the loop 421 and exits out of the outlet aperture 426. The coil 420 may also include flow restrictors 428 to adjust the flow rate of coolant through the coil 420.

The IC-MRI coils 400 and 420 depicted in FIGS. 4A&B represent so-called butterfly type single IC-MRI coils.

Figure 4C:
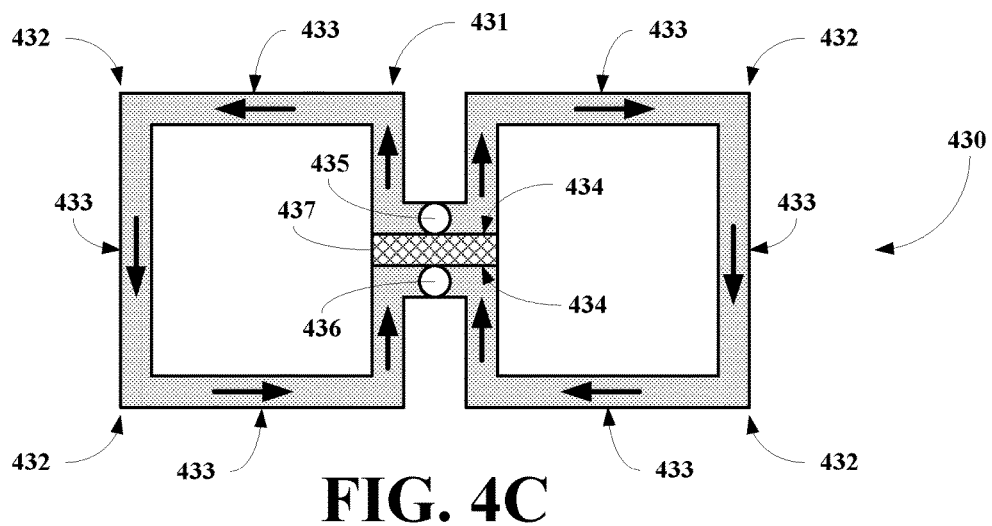
FIGS. 4C-E depict other embodiments of symmetrical IC-MRI coils of this invention including hollow conductors.

Referring to FIG. 4C, another embodiment of an IC-MRI coil of this invention, generally 430, is shown to include a hollow loop 431 with rectangular corners 432, straight portions 433 and two capacitor portions 434. The IC-MRI coil 430 also includes an inlet aperture 435. The inlet aperture 435 is adapted to receive a coolant inlet conduit (not shown). The IC-MRI coil 430 also includes an outlet aperture 436. The outlet aperture 436 is adapted to receive a coolant outlet conduit (not shown). The IC-MRI coil 430 also includes a capacitor 437 interposed between the two capacitor portions 434, where the capacitor 437 is adapted to adjust a capacitance of the IC-MRI coil 430. As shown in the figure by the flow arrows, the coolant enters the inlet aperture 435 and flows through the loop 431 and exits out of the outlet aperture 436.

Figure 4D:
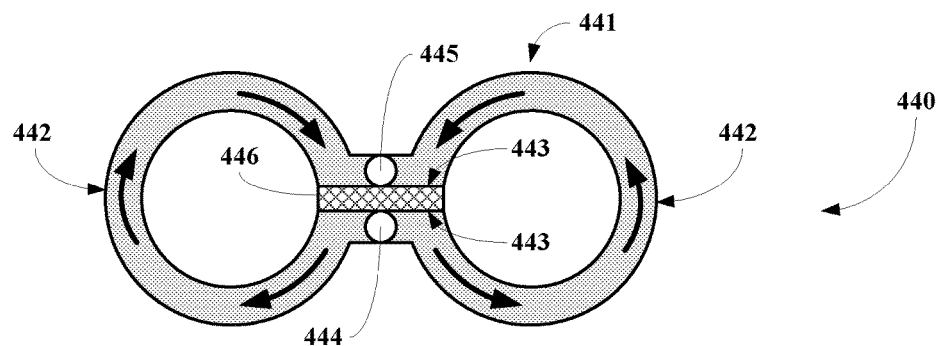

Referring to FIG. 4D, another embodiment of an IC-MRI coil of this invention, generally 440, is shown to include a hollow loop 441 having two circular subloops 442 and two capacitor portions 443. The IC-MRI coil 440 also includes an inlet aperture 444. The inlet aperture 444 is adapted to receive a coolant inlet conduit (not shown). The IC-MRI coil 440 also includes an outlet aperture 445. The outlet aperture 445 is adapted to receive a coolant outlet conduit (not shown). The IC-MRI coil 440 also includes a capacitor 446 interposed between the two capacitor portions 444, where the capacitor 446 is adapted to adjust a capacitance of the IC-MRI coil 440. As shown in the figure by the flow arrows, the coolant enters the inlet aperture 444 and flows through the loop 441 and exits out of the outlet aperture 445.

Figure 4E:
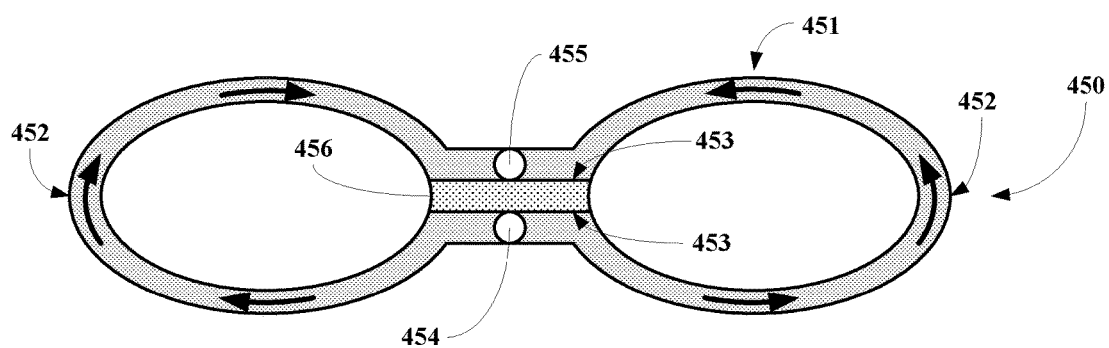

Referring to FIG. 4E, another embodiment of an IC-MRI coil of this invention, generally 450, is shown to include a hollow loop 451 having two ellipsoidal subloops 452 and two capacitor portions 453. The IC-MRI coil 450 also includes an inlet aperture 454. The inlet aperture 454 is adapted to receive a coolant inlet conduit (not shown). The IC-MRI coil 450 also includes an outlet aperture 455. The outlet aperture 455 is adapted to receive a coolant outlet conduit (not shown). The IC-MRI coil 450 also includes a capacitor 456 interposed between the two capacitor portions 453, where the capacitor 456 is adapted to adjust a capacitance of the IC-MRI coil 450. As shown in the figure by the flow arrows, the coolant enters the inlet aperture 454 and flows through the loop 452 and exits out of the outlet aperture 455.

The IC-MRI coils 430, 440 and 450 depicted in FIGS. 4C-E represent so-called dumbbell type single IC-MRI coils.

Figure 4F:
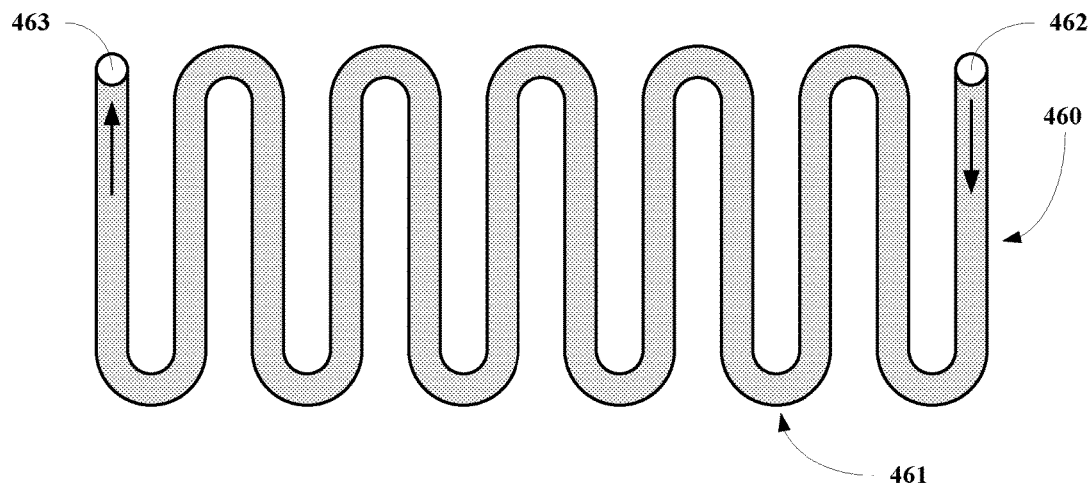
FIGS. 4F-H depict other embodiments of symmetrical IC-MRI coils of this invention including hollow conductors.

Referring to FIG. 4F, another embodiment of an IC-MRI coil of this invention, generally 460, is shown to comprise a sinuous configured hollow tube 461 including a coolant inlet 462 and a coolant outlet 463 to which the inlet and outlet coolant conduits are attached. Coolant flows in the inlet 462 through the tube 461 and out the outlet 463.

Figure 4G:
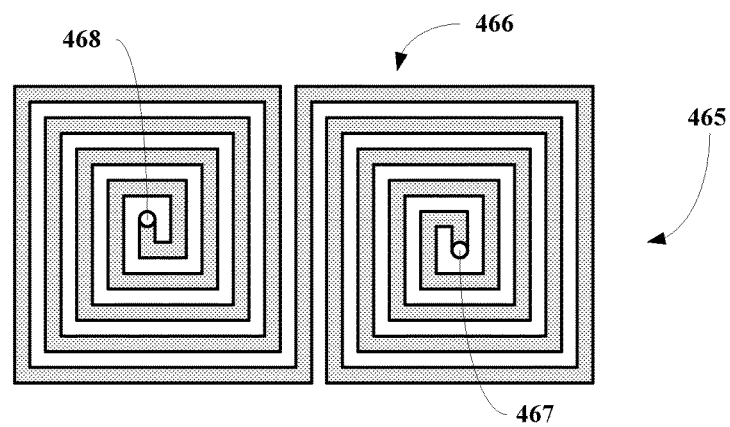

Referring to FIG. 4G, another embodiment of an IC-MRI coil of this invention, generally 465, is shown to comprise a dual rectangular spiral configured hollow tube 466 including a coolant inlet 467 and a coolant outlet 468 to which the inlet and outlet coolant conduits are attached. Coolant flows in the inlet 467 through the tube 466 and out the outlet 468.

Figure 4H:
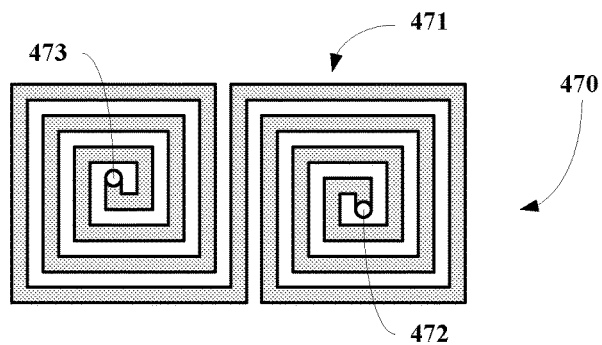

Referring to FIG. 4H, another embodiment of an IC-MRI coil of this invention, generally 470, is shown to comprise a smaller dual rectangular spiral configured hollow tube 471 including a coolant inlet 472 and a coolant outlet 473 to which the inlet and outlet coolant conduits are attached. Coolant flows in the inlet 472 through the tube 471 and out the outlet 473.

Figure 4I:
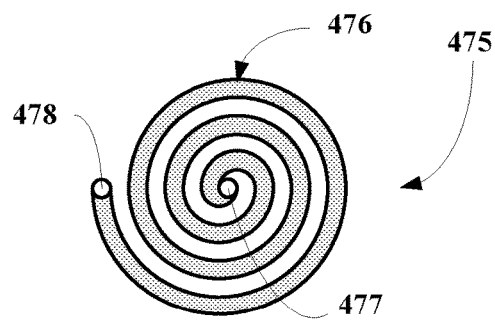
FIGS. 4I-K depict other embodiments of symmetrical IC-MRI coils of this invention including hollow conductors.

Referring to FIG. 4I, another embodiment of an IC-MRI coil of this invention, generally 475, is shown to comprise a circular spiral configured hollow tube 476 including a coolant inlet 477 and a coolant outlet 478 to which the inlet and outlet coolant conduits are attached. Coolant flows in the inlet 477 through the tube 476 and out the outlet 478.

Figure 4J:
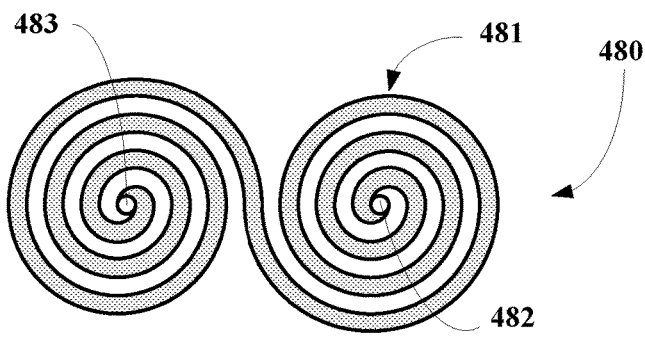

Referring to FIG. 4J, another embodiment of an IC-MRI coil of this invention, generally 480, is shown to comprise a dual circular spiral configuration 481 including a coolant inlet 482 and a coolant outlet 483 to which the inlet and outlet coolant conduits are attached. Coolant flows in the inlet 482 through the tube 481 and out the outlet 483.

Figure 4K:
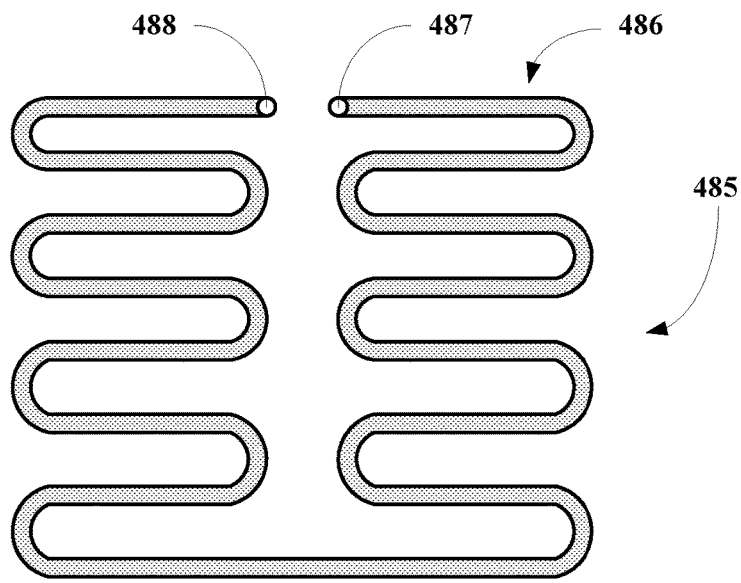

Referring to FIG. 4K, another embodiment of an IC-MRI coil of this invention, generally 485, is shown to comprise a dual sinuous configuration 486 including a coolant inlet 487 and a coolant outlet 488 to which the inlet and outlet coolant conduits are attached. Coolant flows in the inlet 487 through the tube 466 and out the outlet 488.

Single Capacitor, Single IC-MRI Coil Embodiments

Figure 5A:
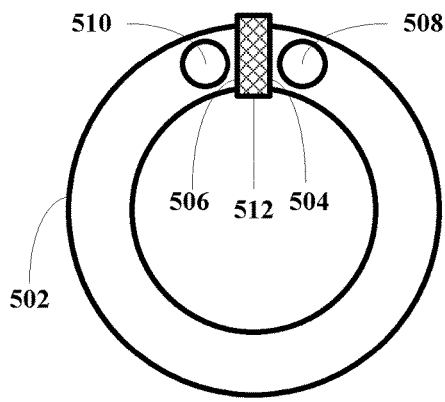
FIGS. 5A-C depict embodiments of single capacitor, single IC-MRI coils.
Figure 5B:
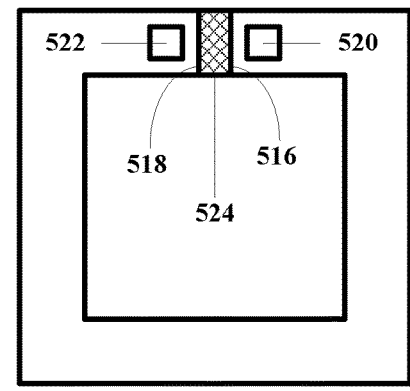
Figure 5C:
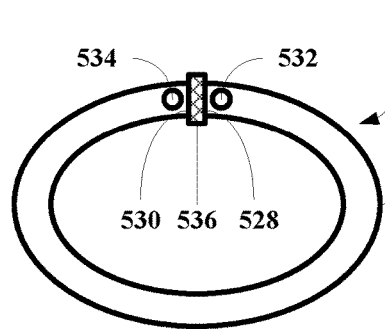

Referring to FIGS. 5A-C, several single capacitor, single coil embodiments of an IC-MRI coil of this invention, generally 500, are shown. Looking at FIG. 5A, a circular hollow tube 502 including an inlet end 504, an outlet end 506, an inlet 508, an outlet 510 and a capacitor 512 interposed between the ends 504 and 506 adapted to adjust the capacitance of the coil. Coolant flows into the inlet 508 through the tube 502 and out the outlet 510. Looking at FIG. 5B, a rectangular hollow tube 514 including an inlet end 516, an outlet end 518, an inlet 520, an outlet 522 and a capacitor 524 interposed between the ends 516 and 518 adapted to adjust the capacitance of the coil. Coolant flows into the inlet 520 through the tube 514 and out the outlet 522. Looking at FIG. 5C, an ellipsoidal hollow tube 526 including an inlet end 528, an outlet end 530, an inlet 532, an outlet 534 and a capacitor 536 interposed between the ends 528 and 530 adapted to adjust the capacitance of the coil. Coolant flows into the inlet 532 through the tube 514 and out the outlet 534.

Dual Capacitor, Single IC-MRI Coil Embodiments

Figure 6A:
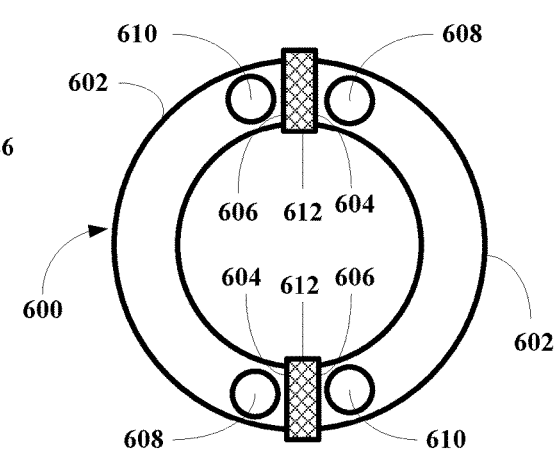
FIGS. 6A-C depict embodiments of dual capacitor, single IC-MRI coils.
Figure 6B:
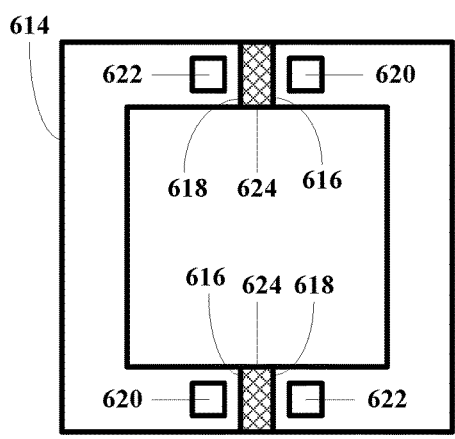
Figure 6C:
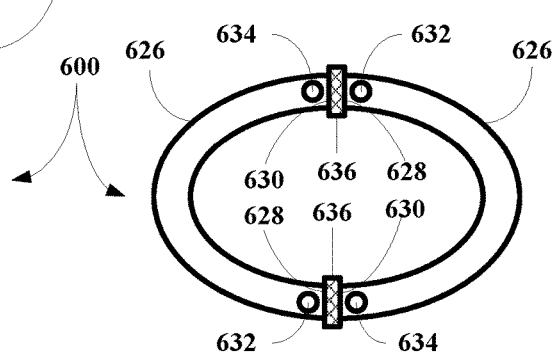

Referring to FIGS. 6A-C, several dual capacitor, single coils embodiments of an IC-MRI coil of this invention, generally 600, are shown. Looking at FIG. 6A, two semi-circular hollow tubes 602 including inlet ends 604, outlet ends 606, inlets 608, outlets 610 and capacitors 612 interposed between the ends 604 and 606 adapted to adjust the capacitance of the coil. Coolant flows into the inlets 604 through the tubes 602 and out the outlets 606. Looking at FIG. 6B, two U-shaped hollow tubes 614 including inlet ends 616, outlet ends 618, inlets 620, outlets 622 and capacitors 624 interposed between the ends 616 and 618 adapted to adjust the capacitance of the coil. Coolant flows into the inlets 620 through the tubes 614 and out the outlets 622. Looking at FIG. 6C, semi-ellipsoidal hollow tubes 626 including inlet ends 628, outlet ends 630, inlets 632, outlets 634 and capacitors 636 interposed between the ends 628 and 630 adapted to adjust the capacitance of the coil. Coolant flows into the inlets 632 through the tubes 626 and out the outlets 634.

Hollow Micro-Tube IC-MRI Coil Embodiment

Figure 7A:
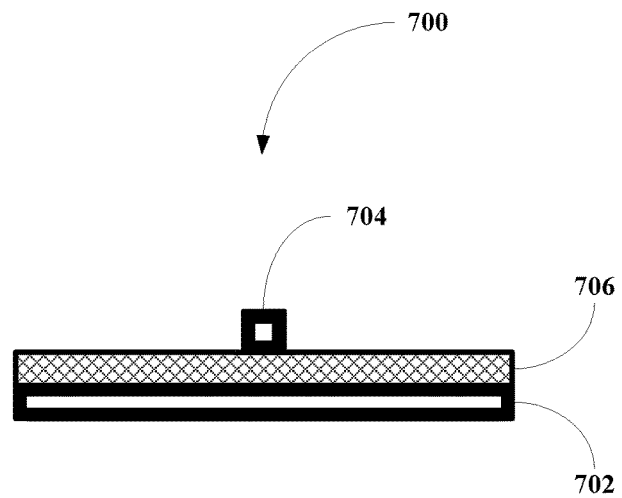
FIGS. 7A&B depict embodiments hollow micro-tube IC-MRI coils.
Figure 7B:
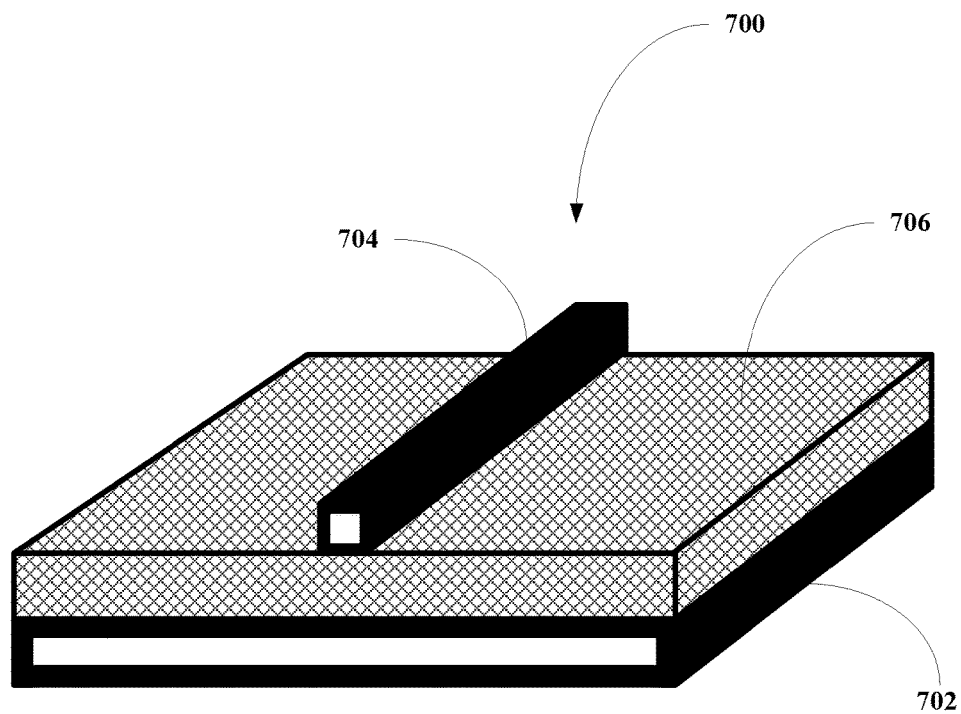

Referring to FIGS. 7A&B, a front view and a perspective view of a micro-tube embodiment of an IC-MRI coil of this invention, generally 700, is shown to include a hollow base tube 702, a micro-hollow tube 704 and an dielectric layer 706 interposed therebetween. The micro-hollow tube 704 may be configured into any coil configuration shown herein.

The IC-MRI coils depicted in FIGS. 4A-K, FIGS. 5A-C, FIGS. 6A-C, and FIGS. 7A&B comprise a conductor such as copper, silver, a superconducting material or mixtures or combinations thereof, where the conductor provides an inductance and a parallel plate capacitor provides an capacitance. The single loop, gap loop, and butterfly type resonator coils comprising contacting tubes are included. These coils comprise basic element coils for making arrays of such coils. The coils may be made of any electrically conducting material including electrically conducting metals, electrically conducting non-metals (e.g., conducting polymers) and/or superconducting materials, especially high temperature superconducting materials.

In certain embodiments, the coolant conduits may be constructed of a conducting material, which would require decoupling capacitors at the point, where the coolant inlet and outlet conduits contact the hollow coils. In other embodiments, the coolant conduits may also be constructed of insulating materials having thermal coefficients of expansion near that of the coil. In other embodiments, the coolant conduits insert into blocks of insulating materials that have very low thermal coefficients of expansion. In certain embodiments, the coolants conduits and blocks are constructed out of G-10.

The IC-MRI coils depicted in FIGS. 4A-K, FIGS. 5A-C, FIGS. 6A-C, and FIGS. 7A&B may also be arranged in arrays to produce IR-MRI arrays.

Micro-Channel IC-MRI Coil Embodiments

Figure 8B:
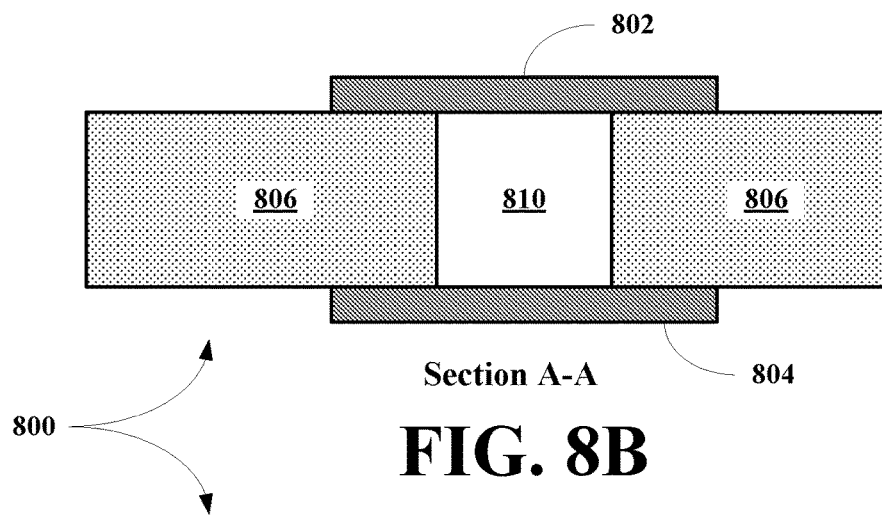
FIGS. 8A&B depict embodiments of single micro-channel IC-MRI coils.
FIGS. 8C&D depict embodiments of multiple micro-channel IC-MRI coils.
Figure 8A:
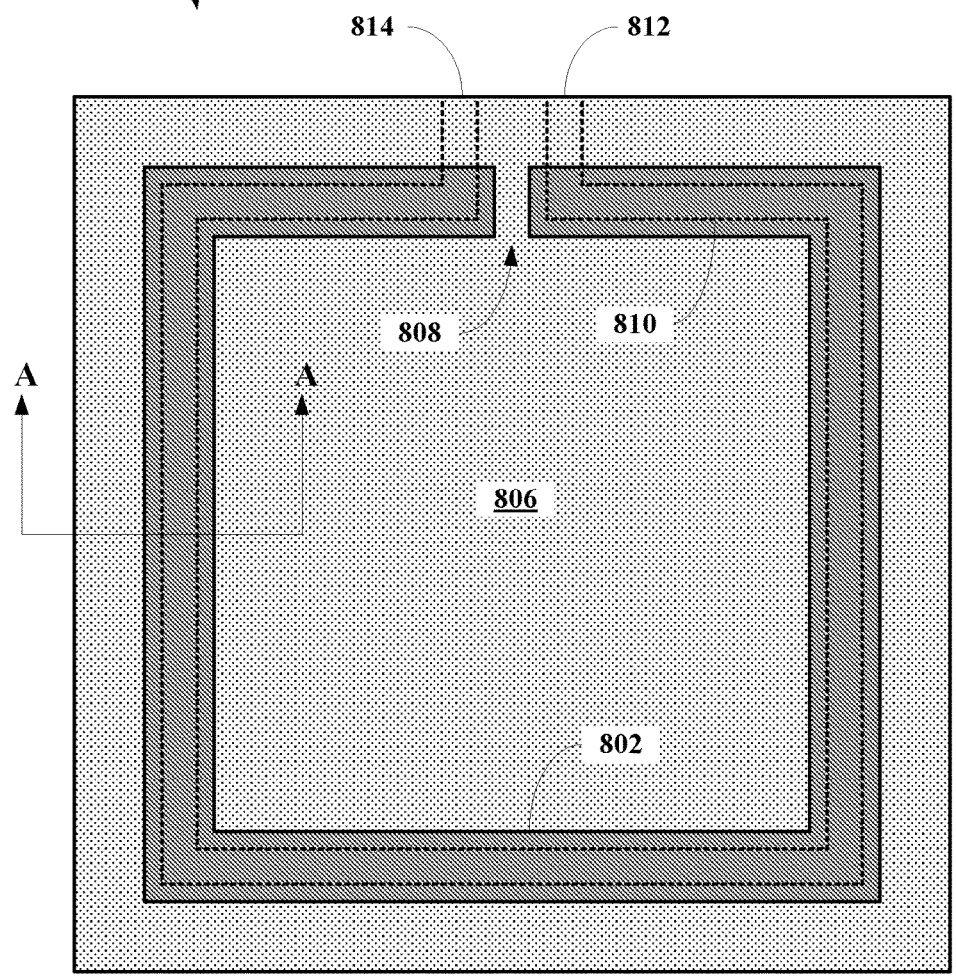
Figure 8D:
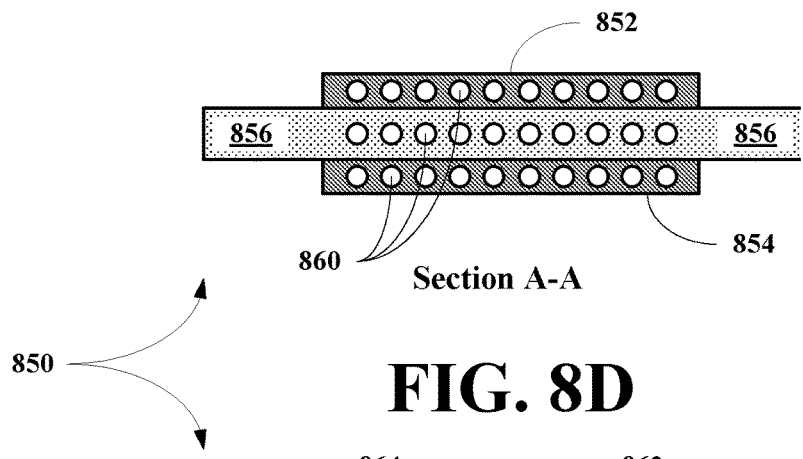

Referring to FIGS. 8A&B, a top plan view and a cross-sectional view of a micro-channel coil embodiment of an IC-MRI coil of this invention, generally 800, are shown, where the coil 800 includes a top conducting layer 802, a bottom conducting layer 804 and a dielectric layer 806 interposed therebetween. The conducting layers 802 and 804 include a built-in capacitor 808. The coil 800 includes an internal micro-flow channel 810 having an inlet 812 and an outlet 814. Coolant flows into the inlet 812 through the channel 810 and out the outlet 814.

Figure 8C:
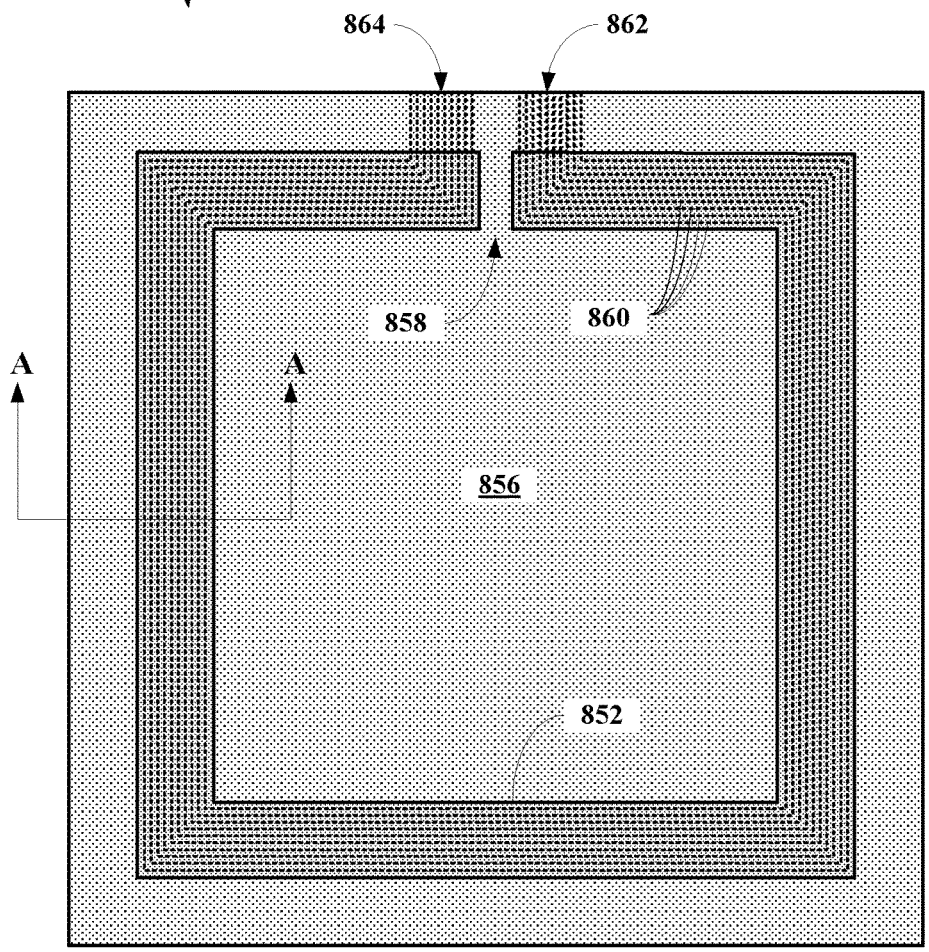

Referring to FIGS. 8C&D, a top plan view and a cross-sectional view of a micro-channel coil embodiment of an IC-MRI coil of this invention, generally 850, are shown, where the coil 850 includes a top conducting layer 852, a bottom conducting layer 854 and a dielectric layer 856 interposed therebetween. The conducting layers 852 and 854 include a built-in capacitor 858. The coil 850 includes ten internal micro-flow channels 860 having inlets 862 and outlets 864. Coolant flows into the inlet 862 through the channel 860 and out the outlet 864.

Micro-Channel IC-MRI Coil Embodiments

Figure 9B:
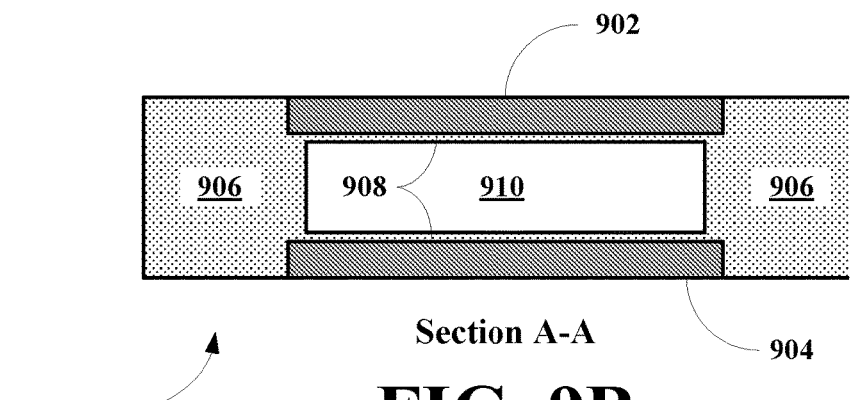
FIGS. 9A&B depict embodiments inlayed single micro-channel IC-MRI coils.
FIGS. 9C&D depict embodiments inlayed multiple micro-channel IC-MRI coils.
Figure 9A:
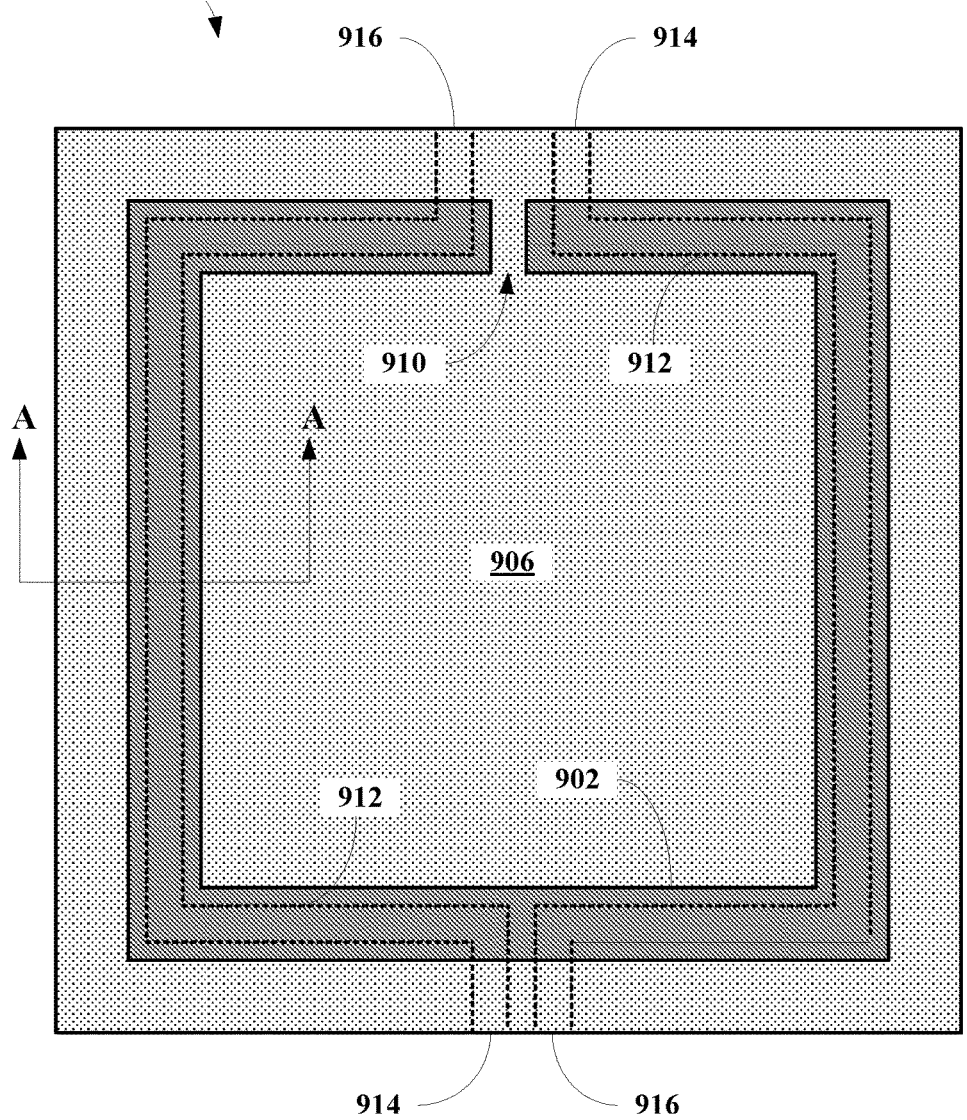
Figure 9D:
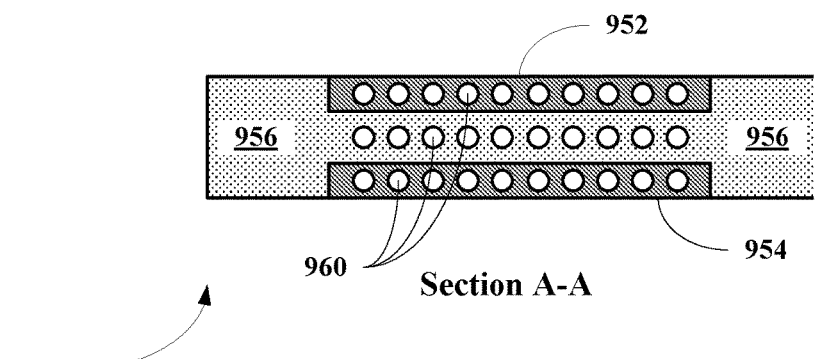

Referring to FIGS. 9A&B, a top plan view and a cross-sectional view of a micro-channel coil embodiment of an IC-MRI coil of this invention, generally 900, are shown, where the coil 900 includes a top conducting layer 902, a bottom conducting layer 904 and a dielectric layer 906 interposed therebetween. The conducting layers 902 and 904 are inlaid in the dielectric layer 906 with thin dielectric layers 908. The conducting layers 902 and 904 include a built-in capacitor 910. The coil 900 includes two internal micro-flow channels 912 having inlets 914 and outlets 916. Coolant flows into the inlets 914 through the channels 912 and out the outlets 916.

Figure 9C:
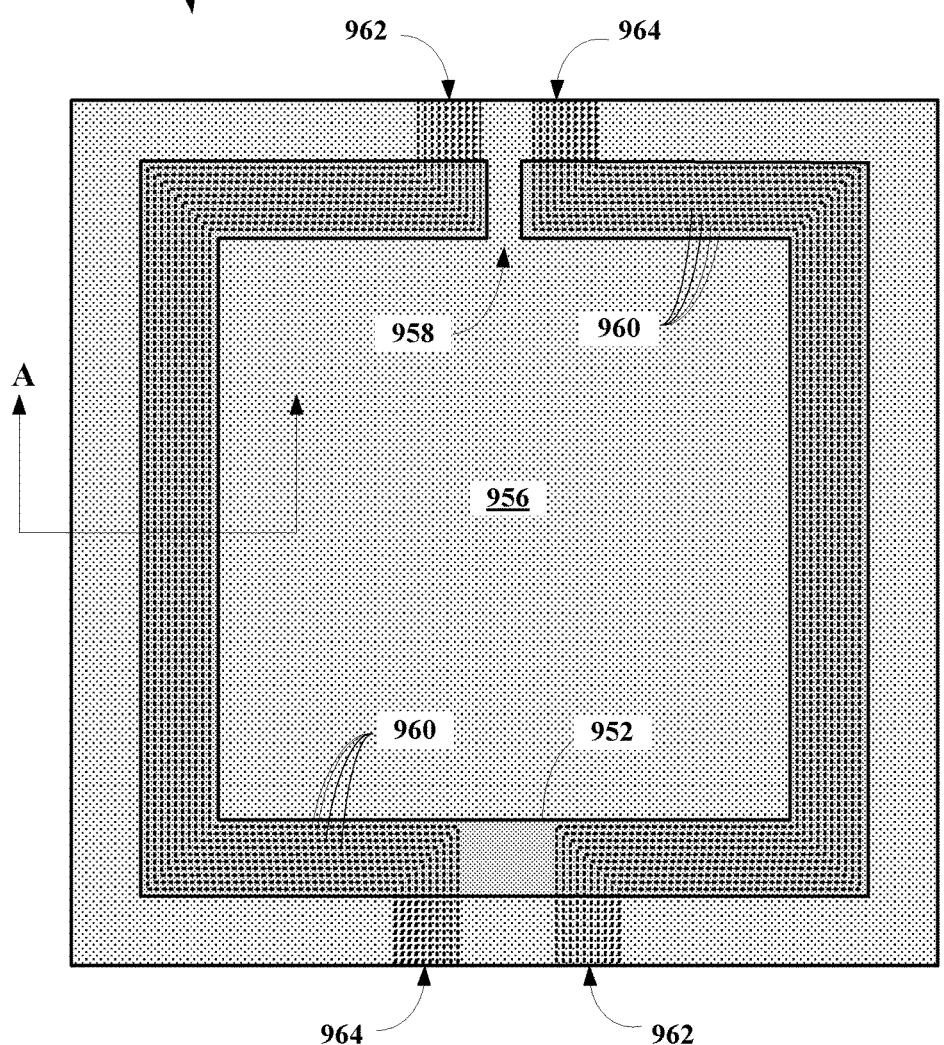

Referring to FIGS. 9C&D, a top plan view and a cross-sectional view of a micro-channel coil embodiment of an IC-MRI coil of this invention, generally 950, are shown, where the coil 950 includes a top conducting layer 952, a bottom conducting layer 954 and a dielectric layer 956 interposed therebetween. The conducting layers 952 and 954 are inlaid in the dielectric layer 956. The conducting layers 952 and 954 include a built-in capacitor 958. The coil 950 includes two sets of ten internal micro-flow channels 960 having inlets 962 and outlets 964. Coolant flows into the inlets 964 through the channels 962 and out the outlets 966.

Micro-Channel IC-MRI Coil Array Embodiments

Figure 10A:
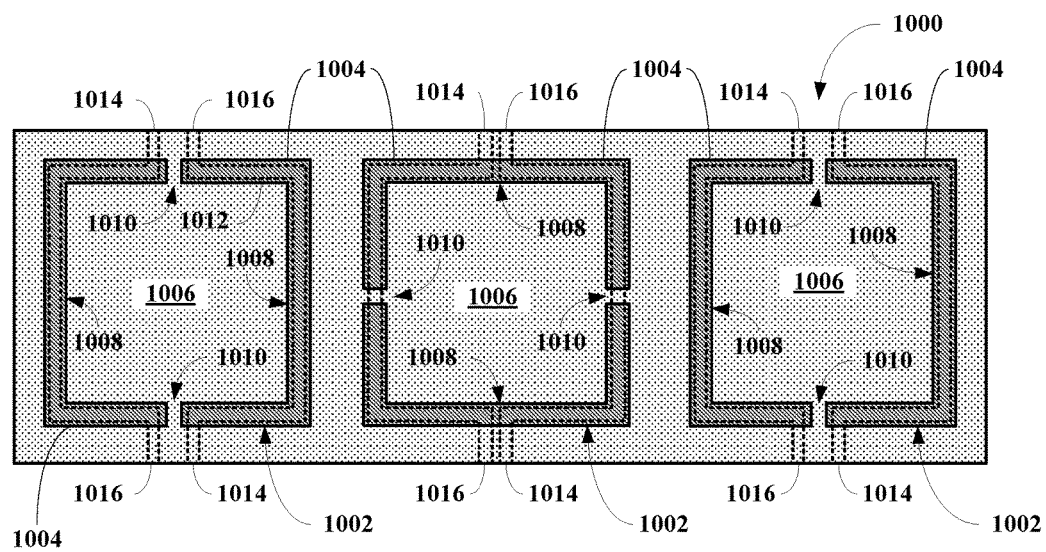
FIGS. 10A&B depict embodiments micro-channel IC-MRI coil assays.

Referring to FIG. 10A, an embodiment of a micro-channel IC-MRI array embodiment of this invention, generally 1000, is shown, where the array 1000 includes three IC-MRI coils 1002. The coils 1002 include top conducting layers 1004, bottom conducting layers (not shown) and a dielectric layer 1006 interposed therebetween. The top conducting layers 1004 and the bottom conducting layers comprises two U-shaped portions 1008 including built in capacitors 1010. The coils 1002 includes internal micro-flow channels 1012 having inlets 1014 and outlets 1016. Coolant flows into the inlets 1016 through the channels 1014 and out the outlets 1018.

Figure 10B:
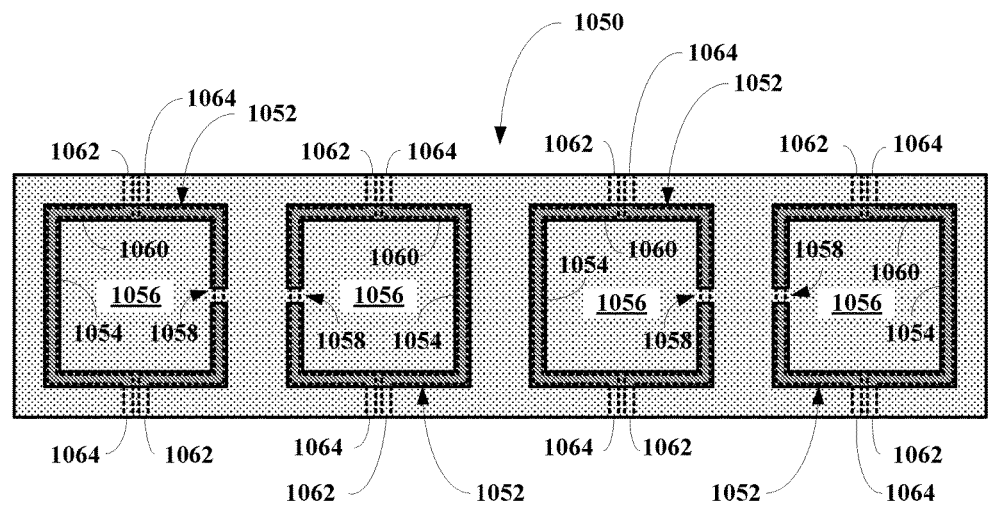
Figure 11A:
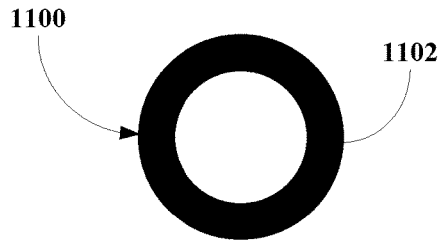
FIGS. 11A-H depict embodiments conducting hollow base tubes.
Figure 11E:
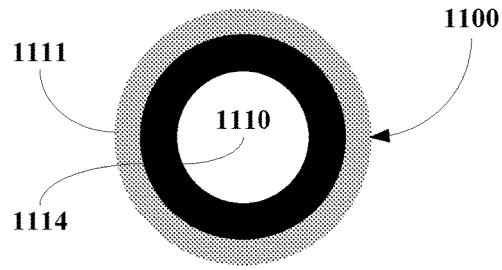
Figure 11B:
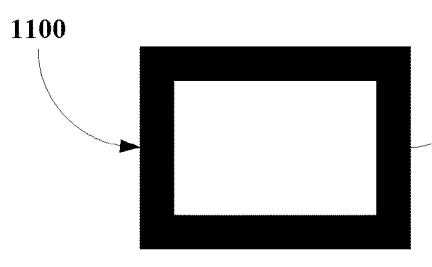
Figure 11F:
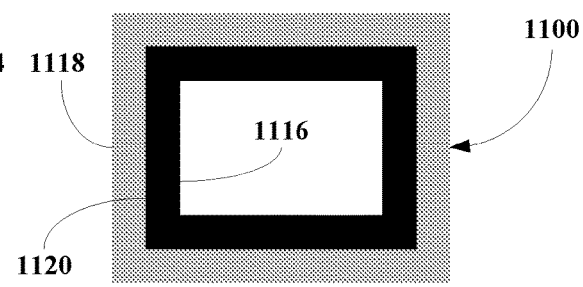
Figure 11C:
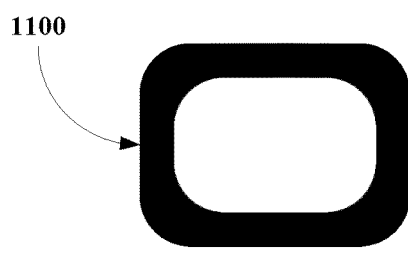
Figure 11G:
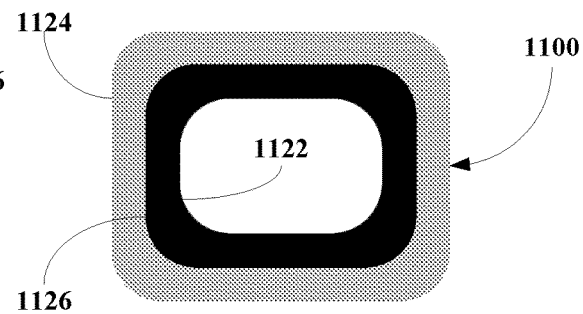
Figure 11D:
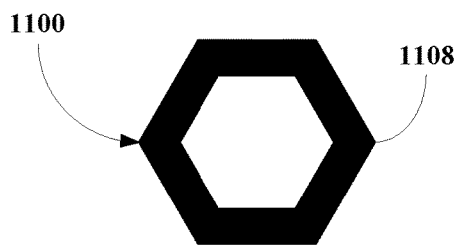
Figure 11H:
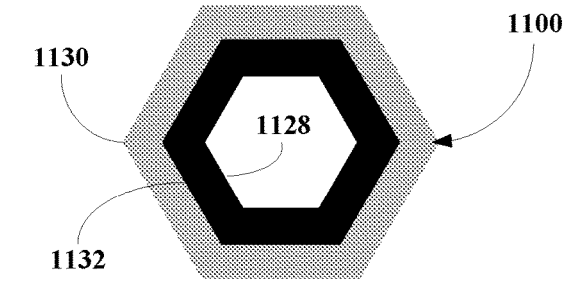
Figure 12A:
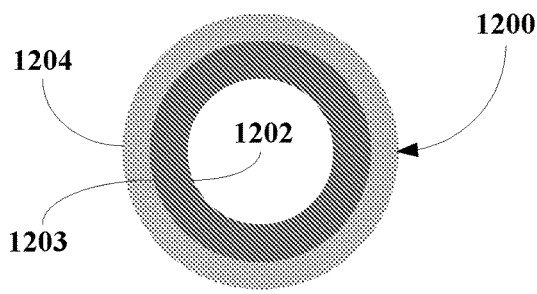
FIGS. 12A-D depict embodiments non-conducting hollow base tubes.
Figure 12B:
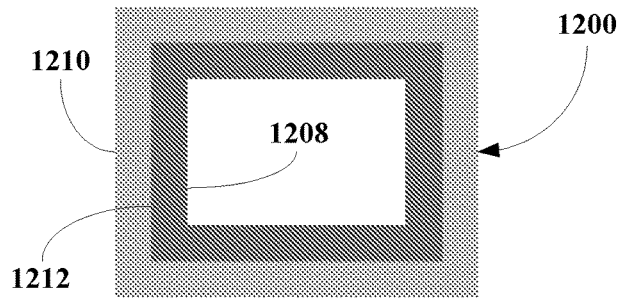
Figure 12C:
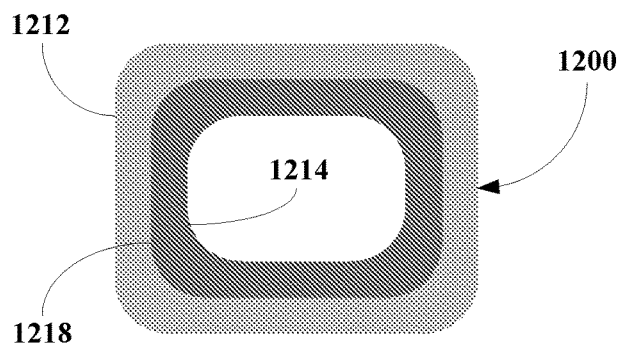
Figure 12D:
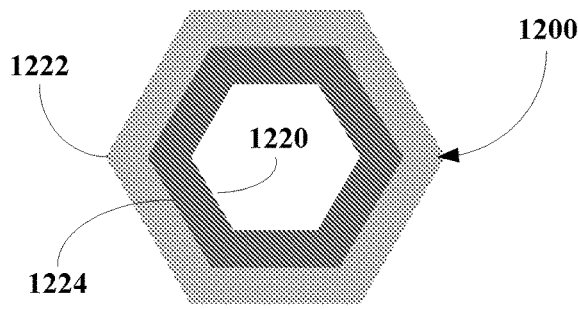
Figure 13A:
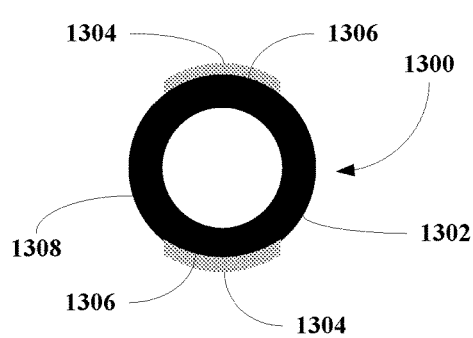
FIGS. 13A-D depict embodiments conducting hollow base tube with opposing superconducting layers.
Figure 13B:
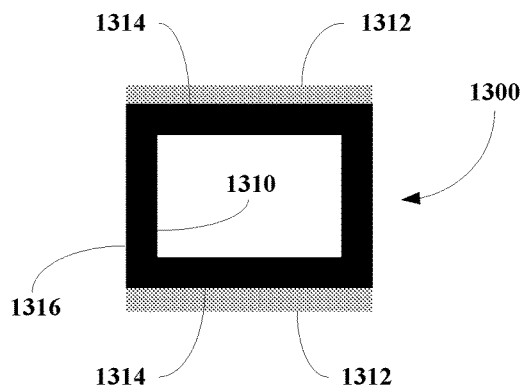
Figure 13C:
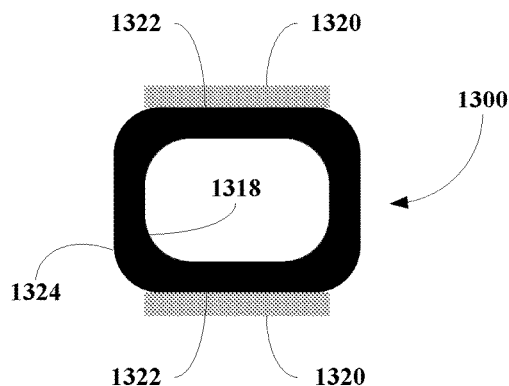
Figure 13D:
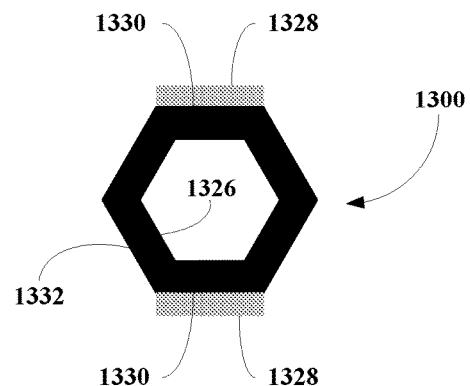
Figure 14A:
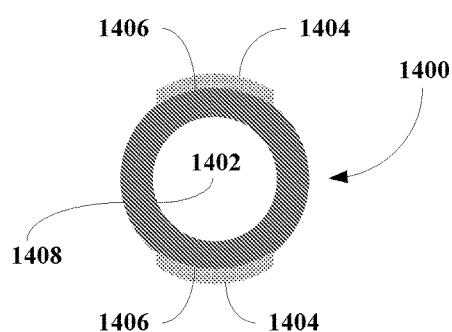
FIGS. 14A-D depict embodiments non-conducting hollow base tube with opposing superconducting layers.
Figure 14B:
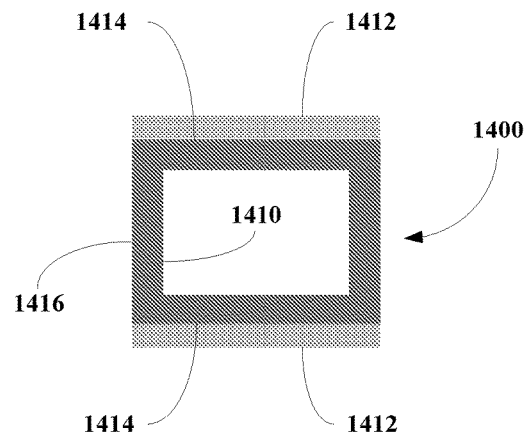
Figure 14C:
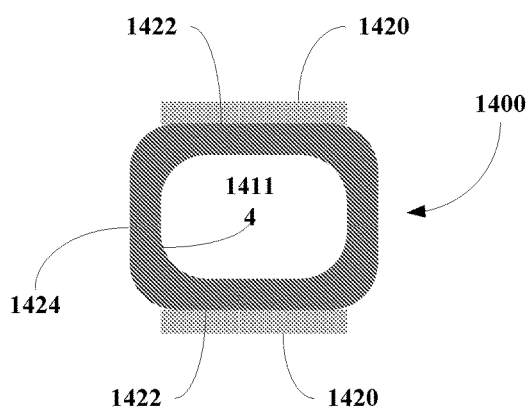
Figure 14D:
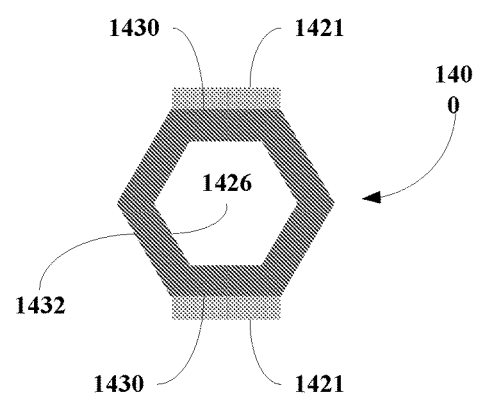

Referring to FIG. 10B, an embodiment of a micro-channel IC-MRI array embodiment of this invention, generally 1050, is shown, where the array 1050 includes four IC-MRI coils 1052. The coils 1052 include top conducting layers 1054, bottom conducting layers (not shown) and a dielectric layer 1056 interposed therebetween. The top conducting layers 1054 and the bottom layer include a built-in capacitor 1058. The coils 1052 includes internal micro-flow channels 1060 having inlets 1062 and outlets 1064. Coolant flows into the inlets 1064 through the channels 1062 and out the outlets 1066.

The coils and arrays depicted in FIGS. 8A-D, FIGS. 9A-D, and FIGS. 10A&B may be formed by stand lithographic methods used in chip manufacturing. For example, a conducting layer may be patterned on a removable substrate. On to the conducting layer pattern, a dielectric may be deposited. The dielectric layer may then be etched to produce the micro-channels. The micro-channels may then be filled with a dissolvable filler. Finally, a corresponding conducting layer may be formed on the dielectric layer over the filler. The substrate and filler is then removed and/or dissolved to produce the finished structure. Alternatively, a conducting layer may be patterned on a dielectric layer. The opposite side of the dielectric layer may be etched to form the micro-channels. Finally, a corresponding conducting layer patterned, etched dielectric layer may be glued or otherwise bonded together to form the final structure.

In the above microchannel embodiments, the micro channels may be metal coated and the coil or coil array would still be intact. In such cases, we have the described situation (no field E inside of a metal tube in which coolant is flowing). Metal coating will act to improve thermal conductivity and thereby improve cooling efficiencies. The micro channels may be coated with metals such as gold or silver, where the coating thickness may be from 1 nm to 1 µm depending on the diameter of the channels.

Hollow Tube Embodiments

Conducting Hollow Base Tubes

Referring to FIGS. 11A-H, an number of hollow tube or conduit embodiments of this invention, generally 1100, are shown, where the base tube in electrically conducting. Looking at FIG. 11A, a electrically conducting tube 1102 having a circular cross-section is shown. Looking at FIG. 11B, a electrically conducting tube 1104 having a rectangular cross-section is shown. Looking at FIG. 11C, a electrically conducting tube 1106 having a rounded edge, rectangular cross-section is shown. Looking at FIG. 11D, a electrically conducting tube 1108 having a hexagonal cross-section is shown. Looking at FIG. 11E, a electrically conducting tube 1110 having a circular cross-section is shown including a superconducting shell 1112 formed on an outer surface 1114 of the tube 1110. Looking at FIG. 11F, a electrically conducting tube 1116 having a rectangular cross-section is shown including a superconducting shell 1118 formed on an outer surface 1120 of the tube 1116. Looking at FIG. 11G, a electrically conducting tube 1122 having a rounded edge rectangular cross-section is shown including a superconducting shell 1124 formed on an outer surface 1126 of the tube 1122. Looking at FIG. 11H, a electrically conducting tube 1128 having a hexagonal cross-section is shown including a superconducting shell 1130 formed on an outer surface 1132 of the tube 1128. In certain embodiments, the conducting tubes are metal tubes such as OFHC copper tubes, but other metals that have low losses at cryogenic temperatures may be used as well.

Non-Conducting Hollow Base Tubes

Referring to FIGS. 12A-D, an number of hollow tube or conduit embodiments of this invention, generally 1200, are shown, where the base tube in electrically non-conducting. Looking at FIG. 12A, a non-conducting tube 1202 having a circular cross-section is shown including a superconducting shell 1204 formed on an outer surface 1206 of the tube 1202. Looking at FIG. 12B, a electrically conducting tube 1208 having a rectangular cross-section is shown including a superconducting shell 1210 formed on an outer surface 1212 of the tube 1208. Looking at FIG. 12C, a electrically conducting tube 1214 having a rounded edge rectangular cross-section is shown including a superconducting shell 1216 formed on an outer surface 1218 of the tube 1214. Looking at FIG. 12D, a electrically conducting tube 1220 having a hexagonal cross-section is shown including a superconducting shell 1222 formed on an outer surface 1224 of the tube 1220.

Conducting Hollow Base Tube with Opposing Superconducting Layers

Referring to FIGS. 13A-H, an number of hollow tube or conduit embodiments of this invention, generally 1300, are shown, where the base tube in electrically conducting with opposing superconducting layers formed thereon. Looking at FIG. 13A, a electrically conducting tube 1302 having a circular cross-section is shown including opposing superconducting layers 1304 formed on opposing portions 1306 of an outer surface 1308 of the tube 1302. Looking at FIG. 13B, a electrically conducting tube 1310 having a rectangular cross-section is shown including opposing superconducting layers 1312 formed on opposing portions 1314 of an outer surface 1316 of the tube 1310. Looking at FIG. 13C, a electrically conducting tube 1318 having a rounded edge rectangular cross-section is shown including opposing superconducting layers 1320 formed on opposing portions 1322 of an outer surface 1324 of the tube 1318. Looking at FIG. 13D, a electrically conducting tube 1326 having a hexagonal cross-section is shown including opposing superconducting layers 1328 formed on opposing portions 1330 of an outer surface 1332 of the tube 1326. In certain embodiments, the conducting tubes are metal tubes such as OFHC copper tubes, but other metals that have low losses at cryogenic temperatures may be used as well.

Non-Conducting Hollow Base Tube with Opposing Superconducting Layers

Referring to FIGS. 14A-D, an number of hollow tube or conduit embodiments of this invention, generally 1400, are shown, where the base tube in electrically non-conducting with opposing superconducting layers formed thereon. Looking at FIG. 14A, a non-conducting tube 1402 having a circular cross-section is shown including opposing superconducting layers 1404 formed on opposing portions 1406 of an outer surface 1408 of the tube 1402. Looking at FIG. 14B, a electrically conducting tube 1410 having a rectangular cross-section is shown including opposing superconducting layers 1412 formed on opposing portions 1414 of an outer surface 1416 of the tube 1410. Looking at FIG. 14C, a electrically conducting tube 1418 having a rounded edge rectangular cross-section is shown including opposing superconducting layers 1420 formed on opposing portions 1422 of an outer surface 1424 of the tube 1418. Looking at FIG. 14D, a electrically conducting tube 1426 having a hexagonal cross-section is shown including opposing superconducting layers 1428 formed on opposing portions 1430 of an outer surface 1432 of the tube 1426.

Electric and Magnetic Field Lines Generated by an IC-MRI Coil

Figure 15:
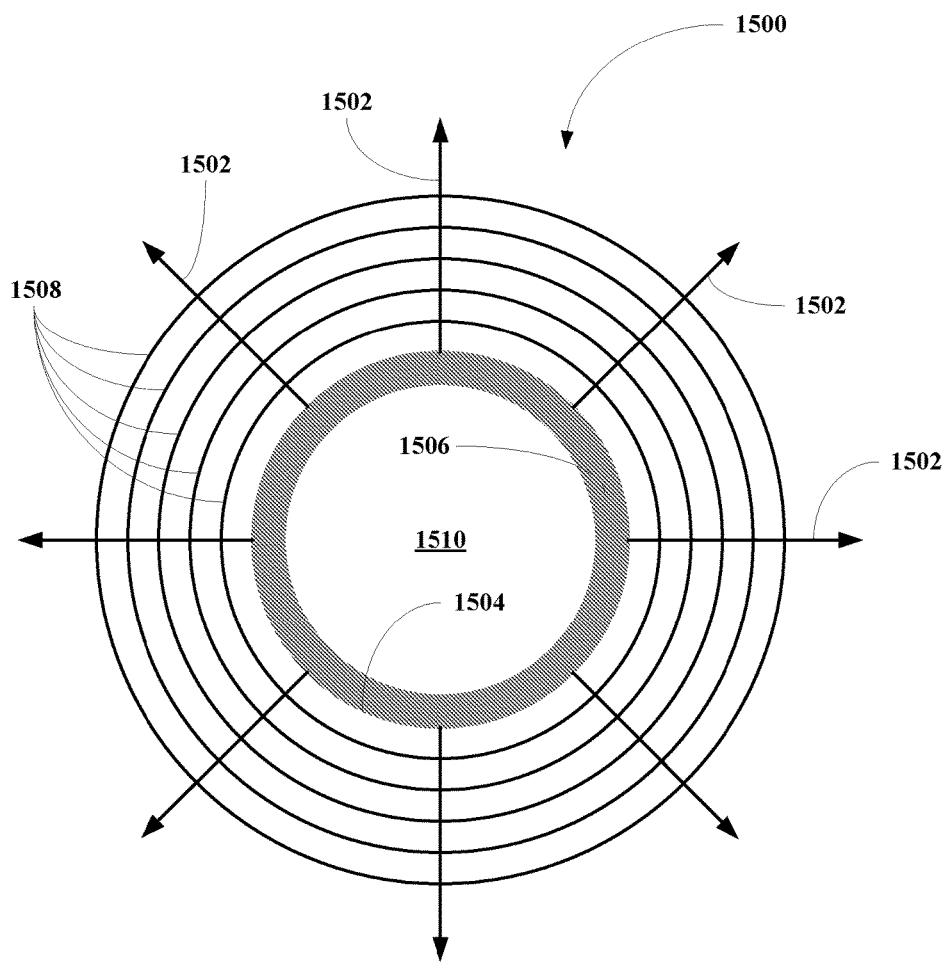
FIG. 15 depicts embodiments electric and magnetic field lines generated by an IC-MRI coil.

Referring to FIG. 15, electric and magnetic field lines generated by a hollow circular IC-MRI coil, generally 1500, is shown. The electric field lines 1502 radiate outward from a surface 1504 of a circular tube 1506, while the magnetic field lines 1508 are concentrically disposed outward from the surface 1504 of the tube 1506. From the figure, it is clear that an interior 1510 of the tube has not electric field.

All references cited herein are incorporated by reference. Although the invention has been disclosed with reference to its preferred embodiments, from reading this description those of skill in the art may appreciate changes and modification that may be made which do not depart from the scope and spirit of the invention as described above and claimed hereafter.

We claim:

1. A magnetic resonance imaging coil comprising:
a conductor,
at least one capacitor, where the capacitor is built in and adjusts a capacitance of the coil, and
at least one internal flow channel within the coil,
where an electric field generated by the conductor is zero or substantially zero.

2. The coil of claim 1, wherein the conductor comprises a conducting tube including a superconducting shell and the flow channel comprises an interior of the tube.

3. The coil of claim 1, wherein the conductor comprises a conducting tube including opposing superconducting layers formed on opposite portions of the tube and the flow channel comprises an interior of the tube.

4. The coil of claim 1, wherein the conductor comprises a non-conducting tube and a conducting shell formed on an outer surface of the tube and the flow channel comprises an interior of the non-conducting tube.

5. The coil of claim 4, wherein the non-conducting tube includes a metal coating on its interior surface to improve thermal conductivity of the non-conducting tube.

6. The coil of claim 1, wherein the conductor comprises a non-conducting tube and wherein the conductor comprises opposing conducting layers formed on opposite portions of the tube and the flow channel comprises an interior of the tube.

7. The coil of claim 6, wherein the non-conducting tube includes a metal coating on its interior surface to improve thermal conductivity of the non-conducting tube.

8. The coil of claim 1, wherein the conductor comprises a pattern of conducting layers formed on a top surface and a bottom surface of a dielectric layer and the flow channel comprises micro-channels formed in the dielectric layer, the conducting layers or both the dielectric layer and the conducting layers.

9. The coil of claim 1, wherein the built in capacitor comprises a dielectric interposed between two portions of the conductor.

10. A magnetic imagining coil system comprising:
a vacuum subsystem including:
a housing comprising:
a top having a top outlet conduit aperture,
a bottom,
an interior,
a vacuum valve, and
a feed through fitting,
a vacuum pump detachably connected to the vacuum valve via a vacuum conduit for evacuating the interior of the housing,
a reservoir, disposed in an upper portion of the housing, including:
a top having:
a reservoir top outlet conduit aperture,
a bottom having:
a reservoir bottom inlet conduit aperture,
a reservoir bottom outlet conduit aperture, and
an interior for receiving a coolant,
a magnetic imagining coil subsystem including:
at least one magnetic imagining coil comprising:
a conductor,
at least one capacitor, where the capacitor adjusts a capacitance of the coil, and
an internal flow channel situated within the conductor,
an electronic subsystem including:
a power supply,
an external electronic unit comprising:
a power cable connected to the power supply,
a signal receiving component,
a processing and analyzing component, and
a display for displaying an magnetic resonance image generated by the processing and analyzing component, and
an internal electronic unit comprising:
tuning/matching and detuning circuitry,
wires connecting the circuitry to the coils,
a power cable connected to the power supply, and
an rf cable connected to the rf receiving component of the external electronic unit, where the cables extend from the internal electronic unit through the fitting.

11. The system of claim 10, wherein the conductor comprises a conducting tube including a superconducting shell and the flow channel comprises an interior of the tube.

12. The system of claim 10, wherein the conductor comprises a conducting tube including opposing superconducting layers formed on opposite portions of the tube and the flow channel comprises an interior of the tube.

13. The system of claim 10, wherein the conductor comprises a non-conducting tube and a conducting shell formed on an outer surface of the tube and the flow channel comprises an interior of the non-conducting tube.

14. The system of claim 13, wherein the non-conducting tube includes a metal coating on its interior surface to improve thermal conductivity of the non-conducting tube.

15. The system of claim 10, wherein the conductor comprises a non-conducting tube and wherein the conductor comprises opposing conducting layers formed on opposite portions of the tube and the flow channel comprises an interior of the tube.

16. The system of claim 15, wherein the non-conducting tube includes a metal coating on its interior surface to improve thermal conductivity of the non-conducting tube.

17. The system of claim 10, wherein the conductor comprises a pattern of conducting layers formed on a top surface and a bottom surface of a dielectric layer and the flow channel comprises micro-channels formed in the dielectric layer, the conducting layers or both the dielectric layer and the conducting layers.

18. The system of claim 10, wherein the capacitor is built in and comprises a dielectric interposed between two portions of the conductor.

19. The system of claim 10, wherein the at least one coil includes:
a dielectric substrate including:
a first conductor disposed on a top surface of the substrate,
a second conductor disposed on a bottom surface of the substrate, and
at least one coolant channel formed in the substrate, where the first conductor and second conductor form the top and bottom of the channels.

20. The system of claim 10, wherein the at least one coil includes:
a dielectric substrate including:
a first conductor disposed on a top surface of the substrate, and
a second conductor disposed on a bottom surface of the substrate,
a plurality of coolant micro channels formed in the substrate.

21. The system of claim 19, the at least one coil further includes:
a plurality of coolant micro channels formed in the first conductor.

22. The system of claim 20, the at least one coil further includes:
a plurality of coolant micro channels formed in the second conductors.

23. The system of claim 19, wherein the capacitor is built in and comprises a dielectric interposed between two portions of the first and second conductors.

24. The system of claim 20, wherein the capacitor is built in and comprises a dielectric interposed between two portions of the first and second conductors.

25. A magnetic imagining coil system comprising:
a housing:
a coolant reservoir,
a coolant outlet conduit,
a coolant inlet conduit,
an interior including:
a magnetic imagining coil comprising:
a conductor,
at least one capacitor, where the capacitor adjusts a capacitance of the coil, and
an internal flow channel situated within the conductor and connected to the coolant inlet and the coolant outlet so that coolant flows through the channel,
an internal electronic unit comprising:
tuning/matching and detuning circuitry,
a cable passthrough fitting,
a power cable passing through the fitting and connected to the internal electronic unit, and
an rf cable passing through the fitting and connected to the internal electronic unit,
where the coolant outlet extends outside the housing.

26. The system of claim 25, wherein the conductor comprises:
a conducting tube including a superconducting shell and the flow channel comprises an interior of the tube;
a conducting tube including opposing superconducting layers formed on opposite portions of the tube and the flow channel comprises an interior of the tube;
a non-conducting tube and a conducting shell formed on an outer surface of the tube and the flow channel comprises an interior of the non-conducting tube.

27. The system of claim 26, wherein the non-conducting tube includes a metal coating on its interior surface to improve thermal conductivity of the non-conducting tube.

28. The system of claim 25, wherein the conductor comprises a non-conducting tube and wherein the conductor comprises opposing conducting layers formed on opposite portions of the tube and the flow channel comprises an interior of the tube.

29. The system of claim 28, wherein the non-conducting tube includes a metal coating on its interior surface to improve thermal conductivity of the non-conducting tube.

30. The system of claim 25, wherein the conductor comprises a pattern of conducting layers formed on a top surface and a bottom surface of a dielectric layer and the flow channel comprises micro-channels formed in the dielectric layer, the conducting layers or both the dielectric layer and the conducting layers.

31. The system of claim 25, wherein the capacitor is built in and comprises a dielectric interposed between two portions of the conductor.

32. The system of claim 25, wherein the at least one coil includes:
a dielectric substrate including:
a first conductor disposed on a top surface of the substrate,
a second conductor disposed on a bottom surface of the substrate, and
at least one coolant channel formed in the substrate, where the first conductor and second conductor form the top and bottom of the channels.

33. The system of claim 25, wherein the at least one coil includes:
a dielectric substrate including:
a first conductor disposed on a top surface of the substrate, and
a second conductor disposed on a bottom surface of the substrate,
a plurality of coolant micro channels formed in the substrate.

34. The system of claim 33, the at least one coil further includes:
a plurality of coolant micro channels formed in the first conductor.

35. The system of claim 34, the at least one coil further includes:
a plurality of coolant micro channels formed in the second conductors.

36. The system of claim 32, wherein the capacitor is built in and comprises a dielectric interposed between two portions of the first and second conductors.

37. The system of claim 33, wherein the capacitor is built in and comprises a dielectric interposed between two portions of the first and second conductors.

38. The system of claim 25, further comprising:
a power supply,
an external electronic unit comprising:
a power cable connected to the power supply,
a signal receiving component,
a processing and analyzing component, and
a display for displaying an magnetic resonance image generated by the processing and analyzing component.

* * * * *